United States Patent
Uchida

(10) Patent No.: US 9,544,697 B2
(45) Date of Patent: *Jan. 10, 2017

(54) ACOUSTIC TRANSDUCER AND MICROPHONE

(71) Applicant: OMRON Corporation, Kyoto-shi, Kyoto (JP)

(72) Inventor: Yuki Uchida, Shiga (JP)

(73) Assignee: OMRON Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/482,592

(22) Filed: Sep. 10, 2014

(65) Prior Publication Data

US 2015/0078592 A1    Mar. 19, 2015

(30) Foreign Application Priority Data

Sep. 13, 2013 (JP) ................. 2013-190283

(51) Int. Cl.
| | | |
|---|---|---|
| H04R 25/00 | (2006.01) | |
| H04R 19/04 | (2006.01) | |
| H04R 19/00 | (2006.01) | |

(52) U.S. Cl.
CPC ........... *H04R 19/04* (2013.01); *H04R 19/005* (2013.01)

(58) Field of Classification Search
CPC ................................. H04R 17/00; H04R 1/22
USPC ........................................................ 381/191
See application file for complete search history.

(56) References Cited

U.S. PATENT DOCUMENTS

| | | | |
|---|---|---|---|
| 5,440,192 A * | 8/1995 | Kasuga ................. | H02N 2/166 310/323.05 |
| 6,535,460 B2 | 3/2003 | Loeppert et al. | |
| 7,346,178 B2 * | 3/2008 | Zhe ...................... | H04R 31/003 381/174 |
| 7,907,744 B2 * | 3/2011 | Kasai ..................... | G01H 11/06 381/174 |
| 8,111,871 B2 | 2/2012 | Zhang et al. | |
| 8,737,171 B2 * | 5/2014 | Jenkins ................. | B81B 3/0021 257/419 |
| 2008/0031476 A1 | 2/2008 | Wang et al. | |
| 2008/0123878 A1 * | 5/2008 | Zhe ...................... | H04R 31/003 381/191 |
| 2008/0192962 A1 * | 8/2008 | Halteren ................ | H04R 1/222 381/170 |
| 2011/0255721 A1 * | 10/2011 | Chen ...................... | H04R 19/01 381/191 |
| 2012/0091545 A1 * | 4/2012 | Reichenbach ........ | B81B 3/0008 257/416 |
| 2012/0213400 A1 * | 8/2012 | Kasai ..................... | H04R 19/04 381/369 |

\* cited by examiner

*Primary Examiner* — Curtis Kuntz
*Assistant Examiner* — Julie X Dang
(74) *Attorney, Agent, or Firm* — Osha Liang LLP

(57) ABSTRACT

An acoustic transducer has a substrate having a cavity, a vibrating electrode plate disposed above the substrate and having a void portion that allows pressure to escape, a fixed electrode plate disposed above the substrate opposite the vibrating electrode plate, and a leak pressure regulation portion that hinders leakage of air pressure by passing through the void portion when the vibrating electrode plate is not undergoing deformation, and that becomes separated from the void portion and allows pressure to escape by passing through the void portion when the vibrating electrode plate undergoes deformation from being subjected to pressure.

21 Claims, 19 Drawing Sheets

ACOUSTIC TRANSDUCER AND MICROPHONE

BACKGROUND

Field

The present invention relates to an acoustic transducer and a microphone. Specifically, the present invention relates to a capacitance type of acoustic transducer configured by a capacitor structure made up of a vibrating electrode plate (diaphragm) and a fixed electrode plate. The present invention also relates to a microphone that employs this acoustic transducer.

Related Art

FIG. 1A is a schematic diagram showing the structure of a conventional capacitance type of acoustic sensor (acoustic transducer). In an acoustic sensor 11 shown here, a cavity 13 is formed in a substrate 12 made up of a silicon substrate or the like, and a diaphragm 14 (vibrating electrode plate) is provided above the substrate 12 so as to cover the upper opening of the cavity 13. If the diaphragm 14 is rectangular, for example, the four corner portions thereof are supported on the upper surface of the substrate 12 by anchors 15. A dome-shaped back plate 16 is formed on the upper surface of the substrate 12, and the back plate 16 covers the diaphragm 14. A fixed electrode plate 17 is provided on the lower surface of the back plate 16, and the fixed electrode plate 17 opposes the diaphragm 14. Also, a large number of acoustic holes 18 that serve as passages for acoustic vibration are formed in the back plate 16 and the fixed electrode plate 17. Multiple stoppers 19 are provided on the lower surface of the back plate 16 so as to project from the fixed electrode plate 17. The stoppers 19 are provided in order to prevent the diaphragm 14 from sticking (adhering) to and not separating from the fixed electrode plate 17.

With this acoustic sensor 11, when acoustic vibration enters through the cavity 13, the diaphragm 14 vibrates due to the acoustic vibration (change in air pressure), and thus the distance between the diaphragm 14 and the fixed electrode plate 17 changes. The diaphragm 14 and the fixed electrode plate 17 oppose each other in a substantially parallel manner so as to configure a variable capacitor, and therefore when the diaphragm 14 vibrates due to acoustic vibration, the acoustic vibration is converted into change in the capacitance of the variable capacitor.

However, in this kind of capacitance type of acoustic sensor 11, the diaphragm 14 and the hack plate 16 are damaged if a large degree of pressure is applied to the diaphragm 14. Examples of situations in which a large degree of pressure is applied to the diaphragm 14 include the case where the diaphragm 14 is subjected to the pressure of air entering through the cavity 13 in a drop test performed on the acoustic sensor 11, the case where the device, such as a mobile phone, that includes the acoustic sensor 11 is dropped, the case where air is forcefully blown into the mouthpiece of a mobile phone that includes the acoustic sensor 11, the case where the mouthpiece is tapped by a finger or the like, and the case where shockwaves from a jet aircraft enter the cavity 13. If a large degree of pressure P is applied to the diaphragm 14 in this way, as shown in FIG. 1B, the diaphragm 14 bends a large amount due to the pressure P, and the diaphragm 14 collides with the back plate 16. Even if the diaphragm 14 bends, the pressure P applied to the diaphragm 14 does not escape, and therefore the diaphragm 14 and the back plate 16 undergo even larger deformation as shown in FIG. 1C. As a result, there are cases where the diaphragm 14 and the back plate 16 become damaged or cracked due to undergoing large deformation, and the damage resistance of the acoustic sensor 11 is poor.

Note that in the acoustic sensor disclosed in U.S. Pat. No. 6,535,460, the diaphragm is provided so as to cover the upper opening of the cavity, but the diaphragm is not fixed to the substrate. Also, the anchors are provided on the lower surface of the back plate. This acoustic sensor is structured such that when a bias voltage is applied between the diaphragm and the fixed electrode plate, the diaphragm is drawn upward due to the electrostatic attraction force, and the diaphragm is supported by the anchors.

Even with an acoustic sensor structured as disclosed in U.S. Pat. No. 6,535,460, the acoustic resistance is high in order to maintain the frequency characteristics, that is to say pressure is not likely to escape, and therefore when a large degree of pressure is applied to the diaphragm, a phenomenon such as that shown in FIGS. 1B and 1C occurs, and there is the risk of the diaphragm and back plate becoming damaged or cracked.

Also, the acoustic sensor disclosed in U.S. Pat. No. 8,111,871 is structured such that the diaphragm is supported by a spring, and when a large degree of pressure is applied to the diaphragm, the entirety of the diaphragm moves a large amount to allow the air pressure to escape.

However, with the acoustic sensor disclosed in U.S. Pat. No. 8,111,871, a spring suited to detecting acoustic vibration and a spring suited to allowing air pressure to escape cannot be designed independently, and there is a lack of flexibility in terms of design. Also, the spring is a linear member that is formed from the same material as the diaphragm and bent in a zigzag shape, and therefore the strength of the spring is low. Moreover, not only is the inertial force high since the entirety of the diaphragm moves, but also the back plate is not provided, thus leading to low strength with respect to a load other than pressure applied to the diaphragm, such as acceleration (inertial force) due to being dropped or external forces in the manufacturing process.

Also, with the acoustic sensor disclosed in US Application No. 2008/0031476, a plate-shaped deformation suppressing member (upper finger portion) is provided so as to oppose the edge of the upper surface of the diaphragm, and large deformation of the diaphragm is suppressed due to the diaphragm coming into contact with the deformation suppressing member when it undergoes large deformation.

Although deformation of the diaphragm can be suppressed in the structure disclosed in US Application No. 2008/0031476, the tip of the deformation suppressing member comes into contact with the edge of the diaphragm when the diaphragm undergoes large deformation, and therefore stress is concentrated at that location, and the strength of the diaphragm is likely to deteriorate.

U.S. Pat. No. 6,535,460, U.S. Pat. No. 8,111,871, and US Application No. 2008/0031476 are examples of background art.

SUMMARY

One or more embodiments of the present invention provides an acoustic transducer that can maintain the frequency characteristics in acoustic vibration detection while also being able to avoid the concentration of stress and damage to the vibrating electrode plate and the back plate by suppressing deformation of the vibrating electrode plate (diaphragm) when a large degree of air pressure is applied.

An acoustic transducer according to one or more embodiments of the present invention has a substrate having a cavity; a vibrating electrode plate arranged above the substrate and having a void portion configured to allow pressure to escape; a fixed electrode plate arranged above the substrate so as to oppose the vibrating electrode plate; and a leak pressure regulation portion arranged so as to hinder leakage of air pressure by passing through the void portion when the vibrating electrode plate is not undergoing deformation, and to become separated from the void portion and allow pressure to escape by passing through the void portion when the vibrating electrode plate undergoes deformation due to being subjected to pressure. Here, the void portion is a space or gap through which pressure can escape, such as an opening, a recession (notch), a hole, or a slit-shaped opening.

In the acoustic transducer of one or more embodiments of the present invention, the void portion is provided in the vibrating electrode plate, and the leak pressure regulation portion hinders air pressure from leaking by passing through the void portion when the vibrating electrode plate is not undergoing deformation. Accordingly, when normal acoustic vibration is being detected, acoustic vibration is not likely to directly pass through the vibrating electrode plate through the void portion in the vibrating electrode plate, and the acoustic resistance is kept high. The frequency characteristics in the low frequency range are therefore not likely to degrade when normal acoustic vibration is being detected. On the other hand, when a large degree of pressure is applied in the acoustic transducer, the vibrating electrode plate undergoes deformation due to the pressure, and thus the void portion in the vibrating electrode plate separates from the leak pressure regulation portion. As a result, pressure escapes through the void portion in the vibrating electrode plate, thus suppressing deformation of the vibrating electrode plate and preventing damage to and breakage of the vibrating electrode plate.

In an acoustic transducer according to one or more embodiments of the present invention, the void portion is an opening formed in the vibrating electrode plate. In one or more embodiments of the present invention, the leak pressure regulation portion may be a plate-shaped member that is accommodated in the opening in the vibrating electrode plate when the vibrating electrode plate is not undergoing deformation. Also, the leak pressure regulation portion may be arranged in opposition to an upper side or a lower side of the vibrating electrode plate so as to block one of an upper opening and a lower opening of the void portion in the vibrating electrode plate when the vibrating electrode plate is not undergoing deformation (note that blockage by the leak pressure regulation portion in this description does not mean hermitic sealing). In the latter case, the leak pressure regulation portion may be an upper surface of a portion of the substrate that is located so as to block the lower opening of the void portion in the vibrating electrode plate when the vibrating electrode plate is not undergoing deformation. According to one or more embodiments of the present invention, the opening is blocked by the leak pressure regulation portion in the normal operation state so as to prevent the leakage of pressure, but if the vibrating electrode plate undergoes large deformation due to excessive pressure, the opening in the vibrating electrode plate separates from the leak pressure regulation portion so as to open and allow the pressure to escape.

In an acoustic transducer according to one or more embodiments of the present invention, the void portion is a recession that is formed in an edge of the vibrating electrode plate and is recessed toward the interior of the vibrating electrode plate. In one or more embodiments of the present invention, the leak pressure regulation portion may be a plate-shaped member that is located in the recession in the vibrating electrode plate when the vibrating electrode plate is not undergoing deformation. According to one or more embodiments of the present invention, the recession is blocked by the leak pressure regulation portion in the normal operation state so as to prevent the leakage of pressure, but if the vibrating electrode plate undergoes large deformation due to excessive pressure, the recession in the vibrating electrode plate separates from the leak pressure regulation portion so as to open and allow the pressure to escape.

In an acoustic transducer according to one or more embodiments of the present invention, the leak pressure regulation portion is located in the void portion in the vibrating electrode plate when the vibrating electrode plate is not undergoing deformation, and a slit is formed between an edge of the leak pressure regulation portion and an edge of the void portion. This is because if the leak pressure regulation portion and the vibrating electrode plate are in contact, vibration of the vibrating electrode plate will be hindered, the sensitivity of the acoustic transducer will decrease, and the S/N ratio will decrease.

In one or more embodiments of the present invention, it is desirable that the width of the slit is less than or equal to 10 μm. This is because if the width of the slit is greater than 10 μm, the frequency characteristics of the acoustic transducer in the low frequency range will degrade.

In an acoustic transducer according to one or more embodiments of the present invention, a back plate is arranged above the substrate so as to oppose the vibrating electrode plate, a support portion is provided on a surface of the back plate that opposes the vibrating electrode plate, and the leak pressure regulation portion is fixed to the support portion. According to one or more embodiments of the present invention, the leak pressure regulation portion is fixed to the back plate, thus making it possible to prevent the leak pressure regulation portion from undergoing the same deformation or movement as the vibrating electrode plate when a large degree of pressure is applied.

Also, it is desirable that the horizontal cross-sectional area of the support portion (the cross-sectional area of a cross-section parallel to the upper surface of the substrate) is smaller than the area of the leak pressure regulation portion. If the horizontal cross-sectional area of the support portion is smaller than the area of the leak pressure regulation portion, a gap will be formed between the outer peripheral surface of the support portion and the edge of the void portion in the vibrating electrode plate when the vibrating electrode plate undergoes deformation toward the support portion side, and pressure will be able to escape by passing through this gap.

Also, the leak pressure regulation portion may be supported by a plurality of support portions. If the leak pressure regulation portion is supported by multiple support portions, the rigidity of the leak pressure regulation portion increases, and the leak pressure regulation portion is not likely to undergo deformation due to pressure. In this case, if a through-hole is provided in the back plate between adjacent support portions, it is easy to allow pressure to escape to the outside through the through-hole.

In an acoustic transducer according to one or more embodiments of the present invention, the leak pressure regulation portion is fixed to a support portion provided on an upper surface of the substrate. According to one or more embodiments of the present invention, if the vibrating electrode plate is supported by an anchor provided on the upper surface of the substrate, the anchor and the support portion can be created at the same time.

In an acoustic transducer according to one or more embodiments of the present invention, a back plate is arranged above the substrate so as to oppose the vibrating electrode plate, the fixed electrode plate is provided on the back plate so as to oppose the vibrating electrode plate, a plurality of acoustic holes are formed in the back plate and the fixed electrode plate, and a portion of the acoustic holes are overlapped with the void portion in a view from a direction perpendicular to the upper surface of the substrate. According to one or more embodiments of the present invention, pressure that has passed through the void portion in the deformed vibrating electrode plate is likely to escape to the outside through the acoustic holes in the back plate.

In an acoustic transducer according one or more embodiments of to the present invention, a back plate is arranged above the substrate so as to oppose the vibrating electrode plate, the fixed electrode plate is provided on the back plate so as to oppose the vibrating electrode plate, a plurality of acoustic holes are formed in the back plate and the fixed electrode plate, and a portion of the acoustic holes are overlapped with the slit in a view from a direction perpendicular to the upper surface of the substrate. According to one or more embodiments of the present invention, pressure that has passed through the void portion in the deformed vibrating electrode plate is likely to escape to the outside through the acoustic holes in the back plate.

In an acoustic transducer according to one or more embodiments of the present invention, a back plate is arranged above the substrate so as to oppose the vibrating electrode plate, the fixed electrode plate is provided on the back plate so as to oppose the vibrating electrode plate, a plurality of acoustic holes are formed in the back plate and the fixed electrode plate, and the width of the leak pressure regulation portion is greater than the distance between adjacent acoustic holes in a view from a direction perpendicular to the upper surface of the substrate. According to one or more embodiments of the present invention, the acoustic holes located above the leak pressure regulation portion are not likely to be blocked by the vibrating electrode plate, and excessive pressure can be reliably discharged.

In an acoustic transducer according to one or more embodiments of the present invention, a back plate is arranged above the substrate so as to oppose the vibrating electrode plate, and the fixed electrode plate is provided on the back plate so as to oppose the vibrating electrode plate and to not oppose the leak pressure regulation portion. According to one or more embodiments of the present invention, the parasitic capacitance generated between the leak pressure regulation portion and the fixed electrode plate can be reduced.

In an acoustic transducer according to one or more embodiments of the present invention, a back plate is arranged above the substrate so as to oppose the vibrating electrode plate, and a protrusion is provided on the back plate so as to oppose a region of the vibrating electrode plate that is adjacent to the void portion. According to one or more embodiments of the present invention, the vibrating electrode plate comes into contact with the deformed protrusion when subjected to a large degree of pressure, thus making it possible to prevent the vibrating electrode plate from adhering to and not separating from the fixed electrode plate.

In an acoustic transducer according to one or more embodiments of the present invention, the void portion is provided in a region where the amount of deformation of the vibrating electrode plate is large. According to one or more embodiments of the present invention, pressure can be allowed to efficiently escape through the void portion.

In an acoustic transducer according to one or more embodiments of the present invention, the vibrating electrode plate and the leak pressure regulation portion are formed from the same material and have the same thickness. According to one or more embodiments of the present invention, the leak pressure regulation portion and the vibrating electrode plate can be created using the same material and using the same process, thus simplifying the manufacturing of the acoustic transducer. For example, the leak pressure regulation portion and the vibrating electrode plate having the void portion may be formed by forming a thin film over the substrate and dividing the thin film with a slit in a manufacturing process.

An acoustic transducer according to one or more embodiments of the present invention can also be used as a microphone by being combined with a circuit portion.

Note that the present invention includes a combinations of the above-described constituent elements, and many variations are possible according to the combination of the constituent elements.

BRIEF DESCRIPTION OF THE DRAWINGS

FIG. 20 is a schematic cross-sectional diagram of a microphone with an acoustic sensor according to one or more embodiments of the present invention built in.

DETAILED DESCRIPTION

The following describes embodiments of the present invention with reference to the accompanying drawings. Note that the present invention is not limited to the following embodiments, and various design modifications can be made within the scope of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiment 1

Figure 1A:
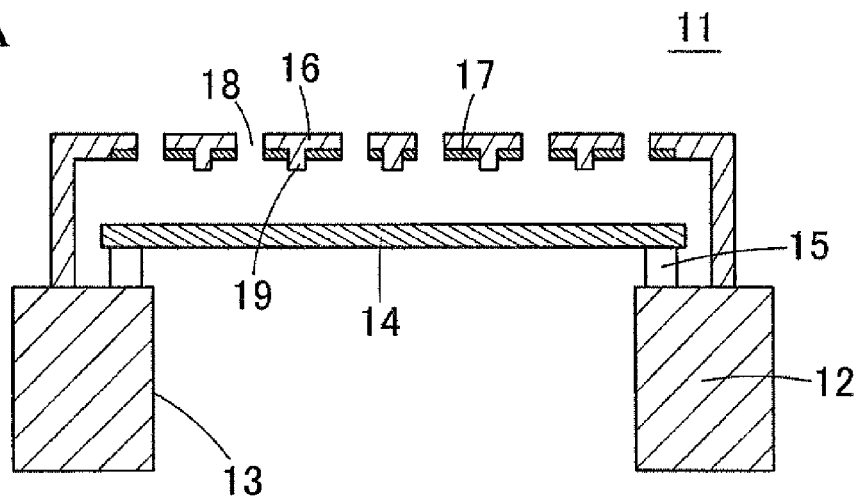
FIG. 1A is a schematic cross-sectional diagram of a conventional capacitance type of acoustic sensor.
Figure 1B:
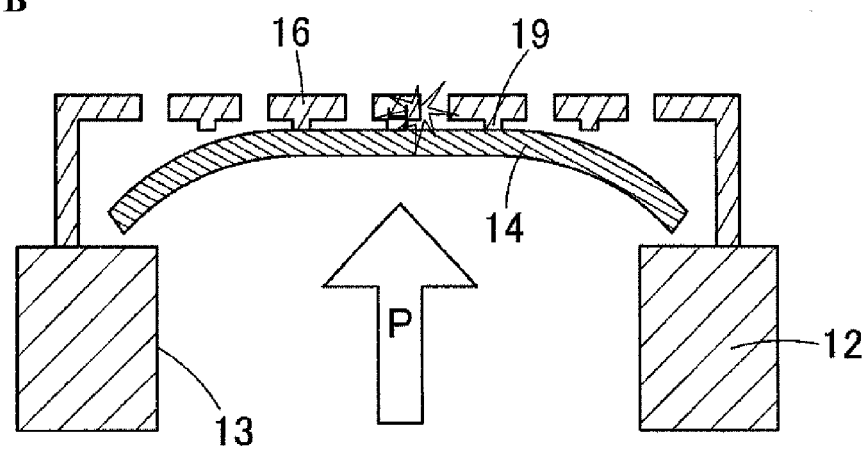
FIG. 1B is a schematic cross-sectional diagram showing how a diaphragm undergoes large deformation when a large degree of pressure is applied to the acoustic sensor in FIG. 1A.
Figure 1C:
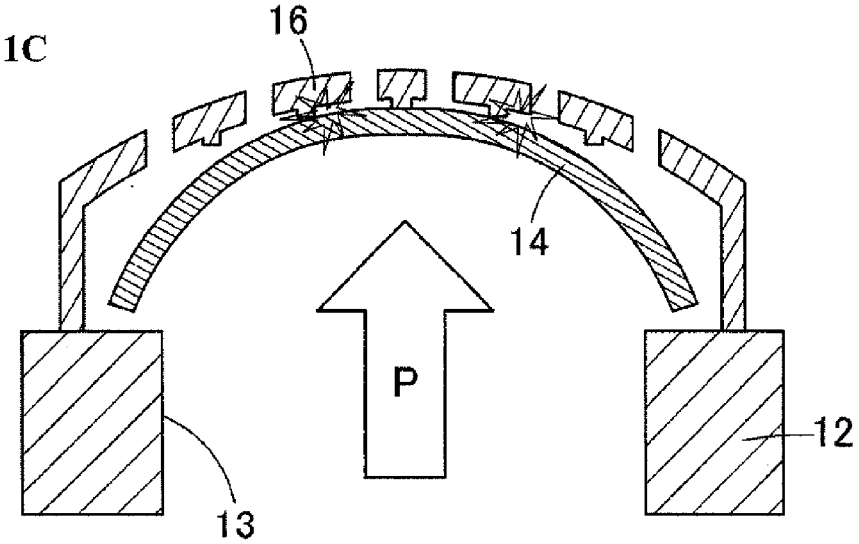
FIG. 1C is a schematic cross-sectional diagram showing how the diaphragm and a back plate undergo large deformation when an even larger degree of pressure is applied to the acoustic sensor in FIG. 1A.
Figure 2A:
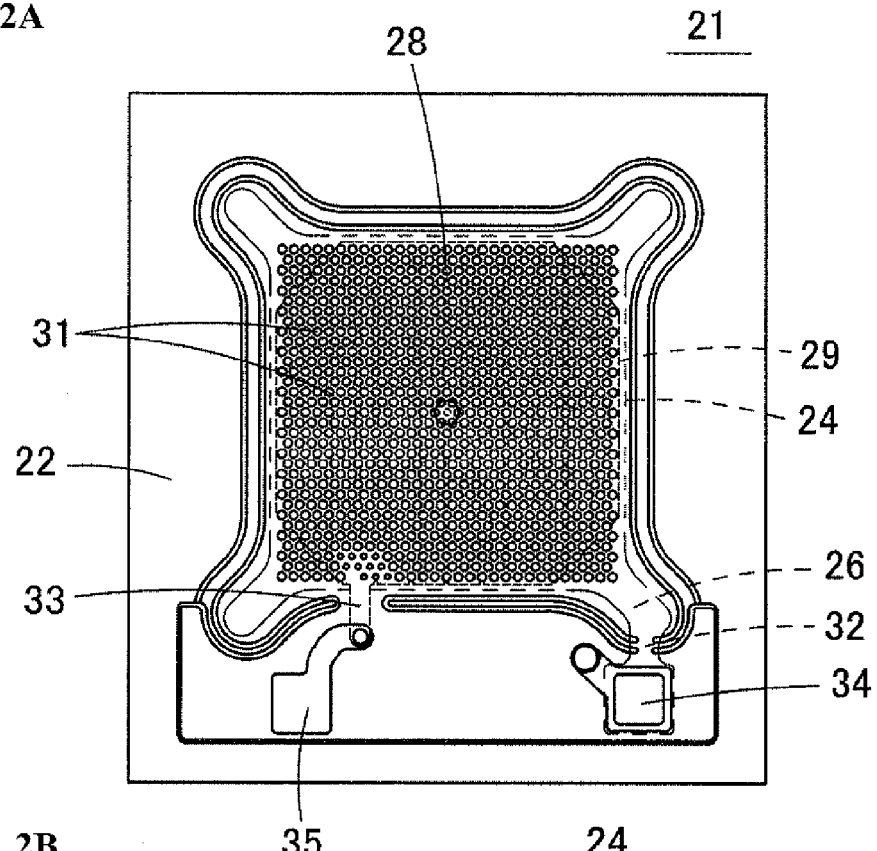
FIG. 2A is a plan view showing an acoustic sensor according to Embodiment 1 of the present invention.
Figure 2B:
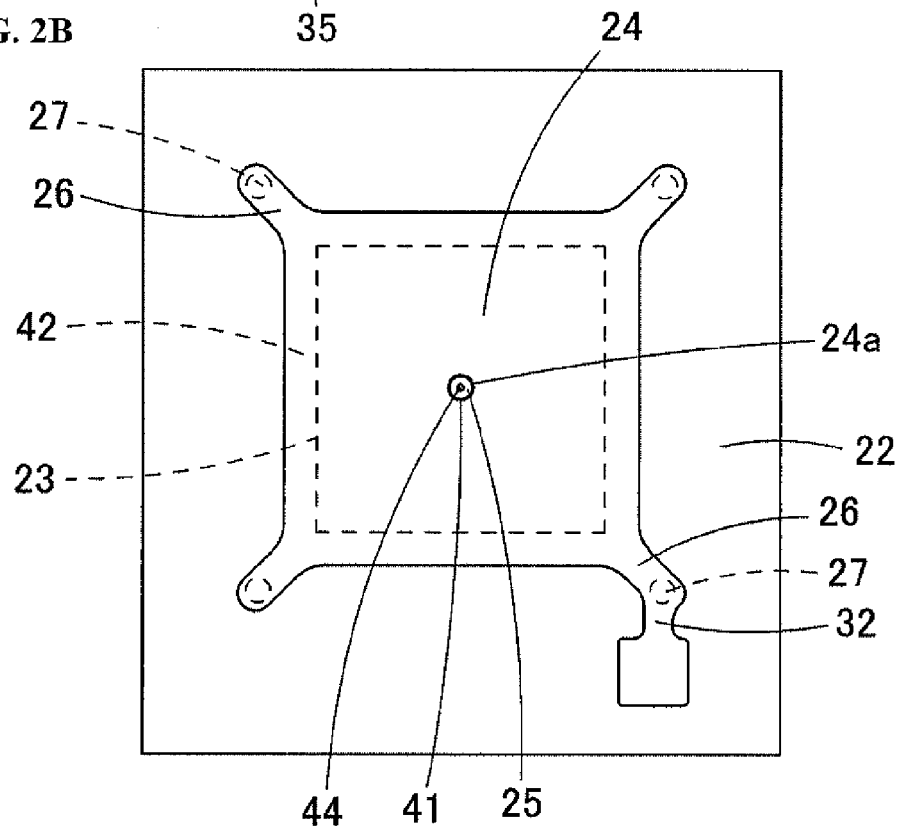
FIG. 2B is a plan view showing a state in which the diaphragm is exposed by removing the back plate and the fixed electrode plate from the acoustic sensor shown in FIG. 2A.
Figure 3:
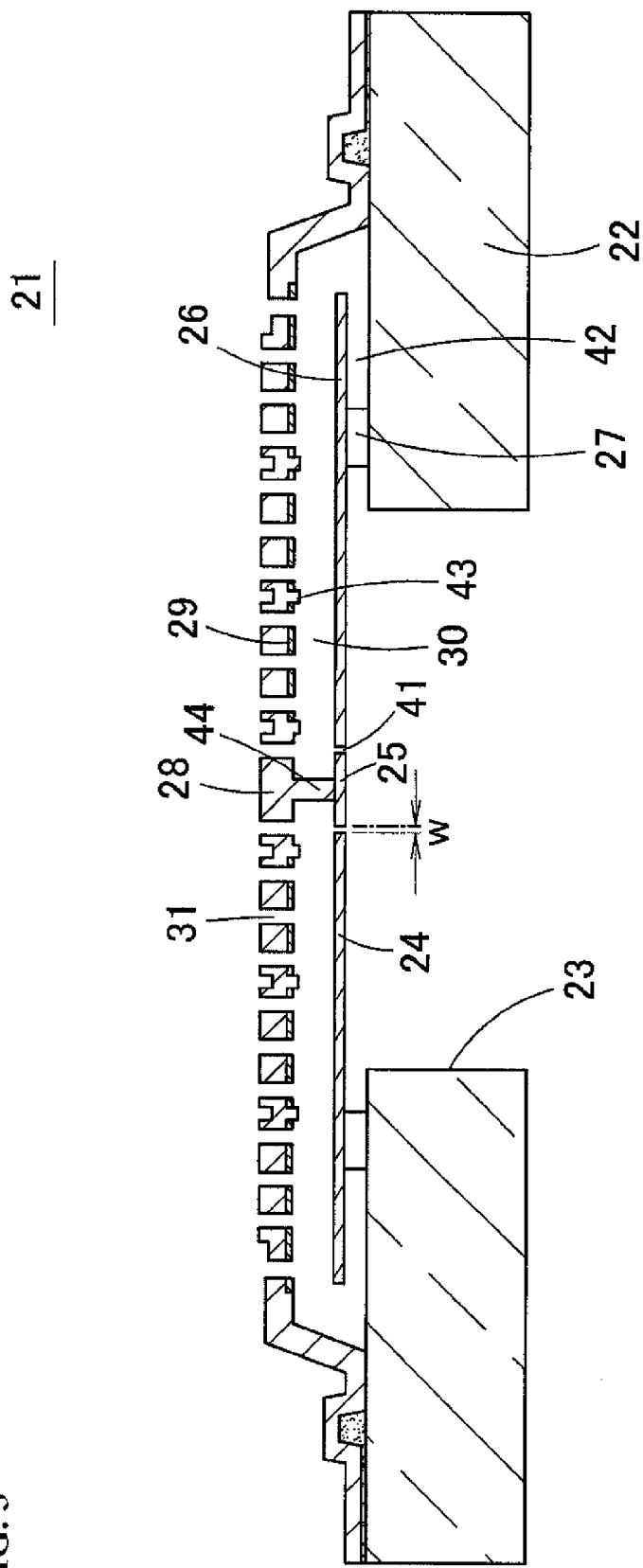
FIG. 3 is an enlarged cross-sectional view of the acoustic sensor shown in FIG. 2A.

The following describes an acoustic transducer according to Embodiment 1 of the present invention, that is to say an acoustic sensor 21, with reference to the drawings. FIG. 2A is a plan view of the acoustic sensor 21 according to Embodiment 1 of the present invention. FIG. 2B is a plan view of a state in which a diaphragm 24 is exposed by removing a back plate 28 and a fixed electrode plate 29 from the acoustic sensor 21 shown in FIG. 2A. FIG. 3 is a cross-sectional diagram of the acoustic sensor 21.

The acoustic sensor 21 is a capacitance type of device created using MEMS technology. As shown in FIG. 3, in the acoustic sensor 21, the diaphragm 24 (vibrating electrode plate) is provided on a substrate 22, which is made of a silicon substrate or the like, via anchors 27, and the fixed electrode plate 29 is provided above the diaphragm 24 in opposition to the diaphragm 24.

A rectangular cavity 23 is formed in the substrate 22 so as to pass from the upper surface to the lower surface. Although the cavity 23 is surrounded by wall surfaces that are perpendicular to the upper surface of the substrate 22 in the illustrated example, it may be surrounded by wall surfaces that are inclined with respect to the upper surface of the substrate 22 so as to have a tapered shape. The diaphragm 24 is arranged on the upper surface of the substrate 22 so as to cover the upper opening of the cavity 23. The diaphragm 24 is formed in a substantially rectangular shape by a conductive polysilicon thin film, and the diaphragm 24 itself serves as a vibrating electrode plate.

As shown in FIG. 2B, a void portion (i.e., a circular opening 24a) is formed in the central portion of the diaphragm 24, and a leak pressure regulation portion 25 (referred to hereinafter as simply the regulation portion 25) that is likewise disc-shaped is located within the opening 24a. The diaphragm 24 and the regulation portion 25 are neither electrically nor mechanically in contact with each other, and they are separated by a circular slit 41 (gap) formed between the inner peripheral surface of the opening 24a and the outer peripheral surface of the regulation portion 25. According to one or more embodiments of the present invention, the width of the slit 41 is less than or equal to 10 μm as will be described later.

The regulation portion 25 is formed using the same material as the diaphragm 24, and using the same manufacturing process. Specifically, the regulation portion 25 and the diaphragm 24 may be manufactured by forming a polysilicon thin film and then dividing it by forming the circular slit 41 by etching. Alternatively, the polysilicon thin film may be formed such that the slit 41 is originally formed between the diaphragm 24 and the regulation portion 25. Accordingly, the diaphragm 24 and the regulation portion 25 are in the same plane and have the same thickness.

The four corner portions of the diaphragm 24 have leg pieces 26 that extend in respective diagonal directions. Four anchors 27 are arranged on the upper surface of the substrate 22 outside the cavity 23. The leg pieces 26 are supported by the respective anchors 27. In this way, the diaphragm 24 is arranged above the substrate 22 so as to cover the upper opening of the cavity 23, and is floating above the upper opening of the cavity 23 and the upper surface of the substrate 22. As a result, a vent hole 42, which is for allowing acoustic vibration to pass from the lower side of the diaphragm 24 to the upper side thereof, or from the upper side of the diaphragm 24 to the lower side thereof, is formed in the gap across which the upper surface of the substrate 22 and the lower surface of the diaphragm 24 oppose each other.

As shown in FIG. 3, the back plate 28 is provided on the upper surface of the substrate 22. The back plate 28 is made of SiN, and a fixed electrode plate 29 made of conductive polysilicon is provided on its lower surface. The back plate 28 is shaped as a dome and has a cavity portion on its underside, and the diaphragm 24 is covered by the cavity portion. A very small air gap 30 is formed between the lower surface of the fixed electrode plate 29 and the upper surface of the diaphragm 24.

A large number of acoustic holes 31 for allowing acoustic vibration to pass are formed in the back plate 28 and the fixed electrode plate 29 so as to pass from the upper surface to the lower surface. As shown in FIG. 2A, the acoustic holes 31 are in a regular arrangement. The acoustic holes 31 are arranged in a triangular shape along three directions that form 120° or 60° angles with each other in the illustrated example, but they may be arranged in a rectangular shape, concentric circles, or the like. Also, stoppers 43 protrude from the lower surface of the back plate 28 with appropriate intervals therebetween. These stoppers 43 are for preventing the diaphragm 24 from adhering to and not separating from the fixed electrode plate 29 due to electrostatic attraction force or the like.

One support portion 44 extends downward from the central portion of the lower surface of the back plate 28, and the regulation portion 25 is fixed horizontally on the lower surface of the support portion 44. The horizontal cross-sectional area of the support portion 44 is smaller than the area of the regulation portion 25. In other words, the diameter of the support portion 44 is smaller than the diameter of the regulation portion 25. Note that the cross-sectional shape of the support portion 44 is not limited to being circular, rectangular, or the like.

As shown in FIGS. 2A and 2B, a lead-out interconnect 32 extends from one of the leg pieces 26 of the diaphragm 24. The tip of the lead-out interconnect 32 is connected to an electrode pad 34 provided on the upper surface of an edge portion of the back plate 28. The electrode pad 34 is therefore in conduction with the diaphragm 24. On the other hand, lead-out interconnect 33 extends from the fixed electrode plate 29, and the tip of the lead-out interconnect 33 is connected to an electrode pad 35 provided on the upper surface of the edge portion of the back plate 28. The electrode pad 35 is therefore in conduction with the fixed electrode plate 29.

Figure 4A:
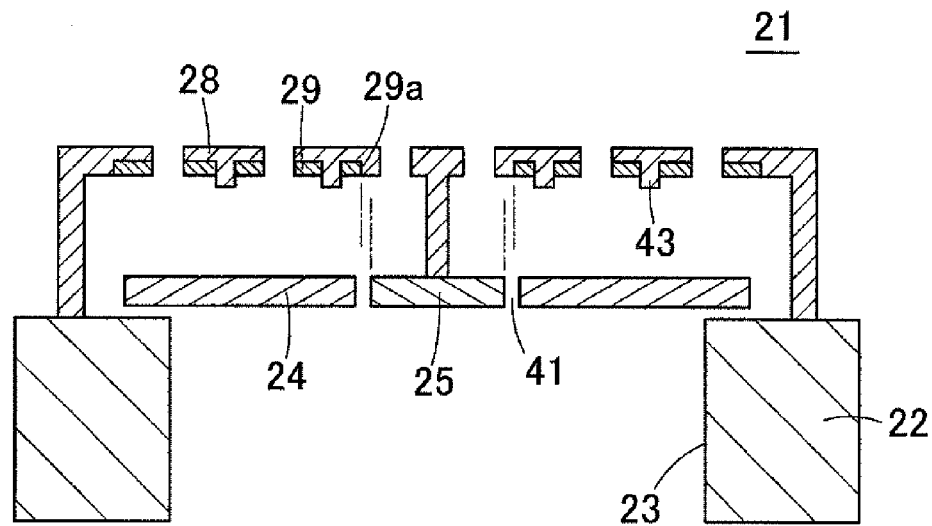
FIGS. 4A and 4B are schematic cross-sectional diagrams for describing operations of the acoustic sensor shown in FIG. 2A.
Figure 4B:
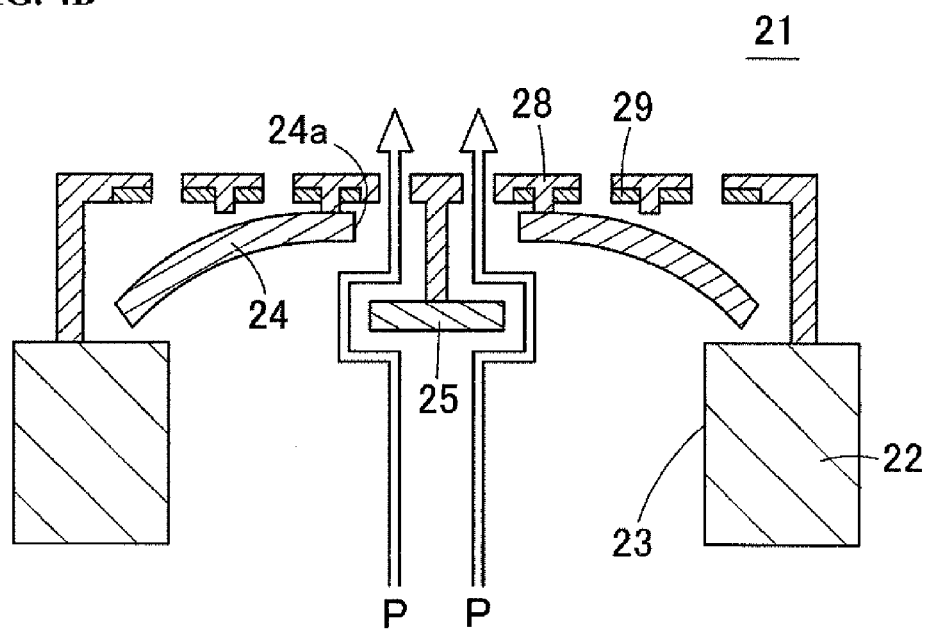

Next, operations when the acoustic sensor 21 detects acoustic vibration and operations of the acoustic sensor 21 when a large degree of pressure is applied to the diaphragm 24 will be described. FIG. 4A is a schematic cross-sectional diagram of the acoustic sensor 21 in a state in which high-load pressure is not being applied to the diaphragm 24. FIG. 4B is a schematic cross-sectional diagram of the acoustic sensor 21 in a state in which high-load pressure is being applied to the diaphragm 24.

In the case where the acoustic sensor 21 is not being subjected to high-load pressure and is detecting only acoustic vibration, the diaphragm 24 vibrates upward and downward with a small amplitude, centered about the flat state shown in FIG. 4A. When the diaphragm 24 vibrates in response to acoustic vibration, a change occurs in the capacitance of the variable capacitor configured by the fixed electrode plate 29 and the diaphragm 24, and the acoustic vibration is converted into an electrical signal through this change in capacitance.

Figure 5:
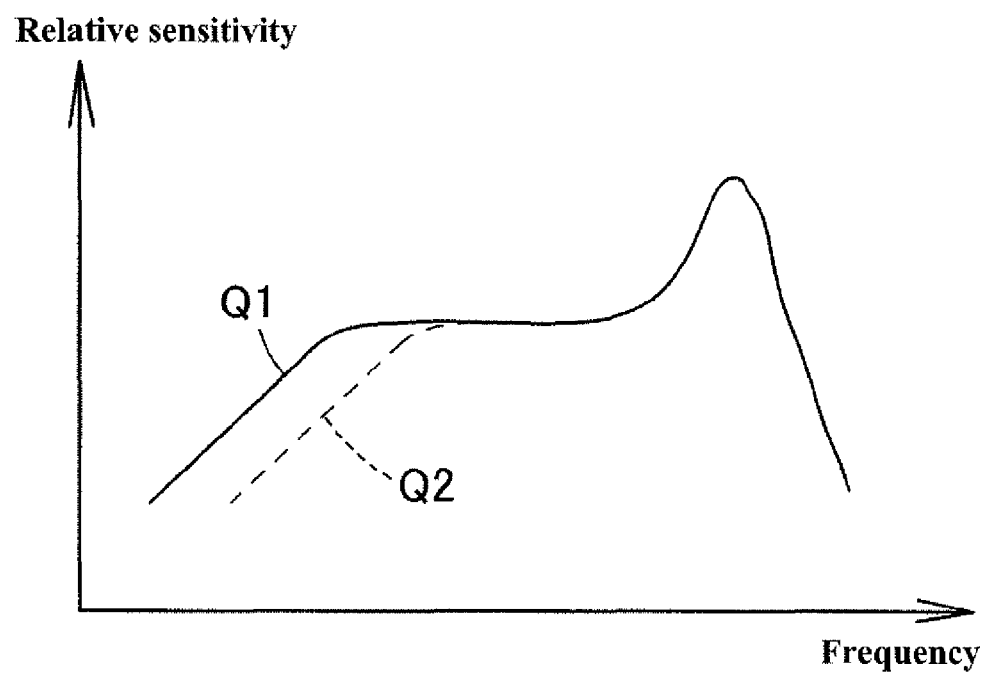
FIG. 5 is a diagram showing typical frequency characteristics in an MEMS microphone.

If the regulation portion 25 were not present at this time, the opening 24a would be in an open state in the central portion of the diaphragm 24, and therefore acoustic vibration would be more likely to pass through the opening 24a than pass through the narrow vent hole 42. For this reason, acoustic resistance in the acoustic path between the upper side and the lower side of the diaphragm 24 would be smaller. Assume that curve Q1 shown by the solid line in FIG. 5 shows the frequency characteristics of the acoustic sensor in the case where the opening 24a is not formed in the diaphragm 24. In the case where the opening 24a is open, the acoustic resistance decreases, and therefore the sensitivity of the acoustic sensor in the low frequency range decreases as shown by a curve Q2 shown by the dashed line in FIG. 5.

However, with the acoustic sensor 21 of Embodiment 1, the opening 24a is formed in the diaphragm 24, but the opening 24a is substantially blocked by the regulation portion 25 in the acoustic vibration detection mode, and therefore acoustic resistance is not likely to decrease, and the sensitivity of the acoustic sensor in the low frequency range is not likely to decrease.

If the diaphragm 24 and the regulation portion 25 are in contact with each other, vibration of the diaphragm 24 is hindered by the regulation portion 25, and there is the risk of a decrease in the sensitivity of the acoustic sensor 21 and a decrease in the S/N ratio. For this reason, the area of the regulation portion 25 is made smaller than the opening area of the opening 24a such that the diaphragm 24 and the regulation portion 25 are separated from each other. Specifically, the slit 41 having a substantially constant width w is provided between the inner peripheral surface of the opening 24a and the outer peripheral surface of the regulation portion 25.

On the other hand, if the width w of the slit 41 is too large, there is the risk that the ventilation effect will intensify, too much air will pass through the slit 41, the roll-off frequency will decrease, and the low frequency characteristics will degrade. This point will be described in detail below.

Aforementioned FIG. 5 shows typical frequency characteristics in a MEMS microphone, and the horizontal axis and the vertical axis in this figure respectively indicate the frequency of acoustic vibration (unit: Hz) and the relative sensitivity (unit: dBr). In FIG. 5, the range in which the plotted line is horizontal is a range in which sound waves can be favorably detected since the relative sensitivity is not dependent on the frequency of the sound waves. The frequency at the lower limit of this range will be referred to as the roll-off frequency f roll-off.

In general, the roll-off frequency f roll-off is dependent on the acoustic resistance R venthole in the acoustic vibration path and the compliance of air in the cavity 23 (air spring constant) C backchamber, and is expressed by the following expression.

$$f\ \text{roll-off} \propto 1/(R\ \text{venthole} \times C\ \text{backchamber}) \qquad \text{Exp. 1}$$

The acoustic resistance R venthole is also influenced by the length of the slit 41, and decreases as the width w of the slit 41 increases. Therefore, according to Exp. 1 above, the roll-off frequency f roll-off will increase, and the low frequency characteristics will degrade as a result. For example, if the width w of the slit 41 is 10 μm, the roll-off frequency f roll-off will be 500 Hz or more. For this reason, if the width w of the slit 41 exceeds 10 μm, the low frequency characteristics degrade significantly, and sound quality is impaired. It is therefore desirable that the width w of the slit 41 is less than or equal to 10 μm.

The diaphragm 24 is subjected to a large degree of pressure in cases such as where the acoustic sensor 21 is subjected to a drop test, the device that includes the acoustic sensor 21 is dropped, or air is forcefully blown into the acoustic sensor 21. If the acoustic sensor 21 is subjected to a large degree of pressure from the cavity 23 side, the diaphragm 24 undergoes deformation due to the large degree of pressure P, but the regulation portion 25 is supported by the support portion 44 and therefore does not move along with the diaphragm 24. Also, since the regulation portion 25 is smaller than the diaphragm 24, the regulation portion 25 does not undergo deformation along with the diaphragm 24 even when subjected to a large degree of pressure. For this reason, if the diaphragm 24 undergoes large deformation, the regulation portion 25 comes out of the opening 24a so as to free the opening 24a, thus forming a space for allowing the passage of the pressure P between the inner peripheral surface of the opening 24a and the outer peripheral surface of the support portion 44 whose diameter is smaller than that of the regulation portion 25. As a result, as shown in FIG. 4B, the pressure P escapes to the outside through the opening 24a and the acoustic holes 31, and the pressure applied to the diaphragm 24 decreases, and therefore the amount of deformation of the diaphragm 24 decreases. For this reason, the amount of shock that the diaphragm 24 applies to the back plate 28 decreases, a large amount of stress is not likely to be applied to the diaphragm 24 and the back plate 28, and the diaphragm 24 and the back plate 28 are not likely to become damaged or cracked (i.e., damage resistance is improved).

Figure 6A:
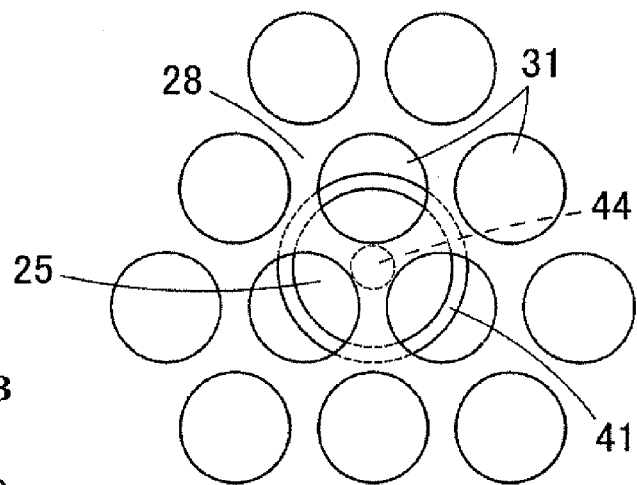
FIGS. 6A to 6C are diagrams showing the positional relationship between a support portion, a leak pressure regulation portion, and acoustic holes in an acoustic sensor.
Figure 6B:
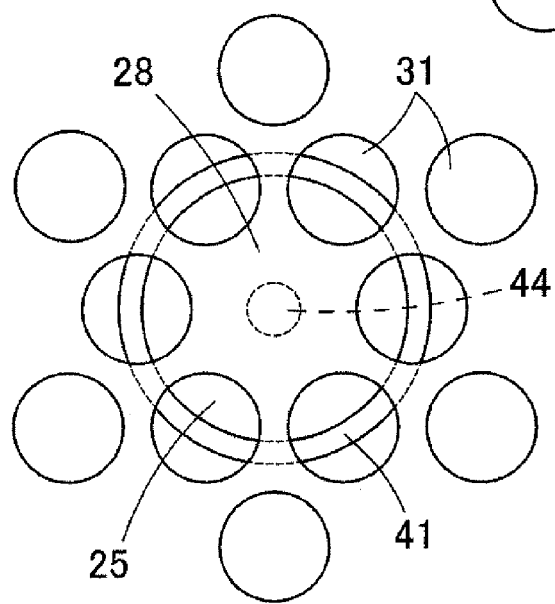
Figure 6C:
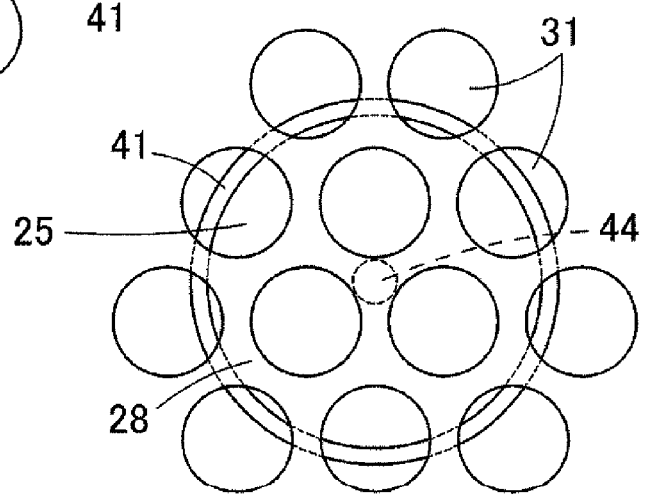

In order for the pressure P that passed through the opening 24a to smoothly escape to the outside through the acoustic holes 31 at this time, it is desirable that a portion of the acoustic holes 31 are overlapped with the opening 24a of the diaphragm 24 in a view from a direction perpendicular to the upper surface of the substrate 22 as shown in FIGS. 6A to 6C. In FIG. 6A, the regulation portion 25 is supported by a support portion 44 provided in the central portion between acoustic holes 31, and the acoustic holes 31 that are closest to the support portion 44 are overlapped with the opening 24a. In FIG. 6B, an acoustic hole 31 is not provided at one location where an acoustic hole 31 is to be provided, the regulation portion 25 is supported by a support portion 44 provided at that location, and the acoustic holes 31 that are closest to the support portion 44 are overlapped with the opening 24a. Also, in FIG. 6C, the acoustic holes 31 that are closest to the support portion 44 are entirely overlapped with the opening 24a.

Also, it is desirable that the width of the regulation portion 25 is larger than the distance between adjacent acoustic holes 31 (distance between their edges). This is because if the width of the regulation portion 25 is smaller than the distance between adjacent acoustic holes 31 (distance between their edges), the acoustic holes 31 will be blocked by the edge of the diaphragm 24 such that the path for escape of the pressure P will be blocked.

It is desirable that the opening 24a of the diaphragm 24 is provided at the location where the amount of deformation of the diaphragm 24 is largest, that is to say, is provided in the central portion of the diaphragm 24. This is because the location where the diaphragm 24 undergoes the largest amount of deformation is thought to be the location where it is subjected to the largest degree of pressure, and therefore providing the opening 24a at this location improves the effect of allowing pressure to escape.

Also, with the acoustic sensor 21, an elastic constant of the diaphragm 24 suited to the detection of acoustic vibration and an elastic constant of the regulation portion 25 suited to allowing a large degree of pressure to escape can be designed independently, thus raising the degree of freedom in design. Furthermore, with this structure of the acoustic sensor 21, the diaphragm 24 does not bend a large amount when subjected to inertial force in a drop, external force in the manufacturing process, and the like as with the acoustic sensor disclosed in U.S. Pat. No. 8,111,871, and strength with respect to loads other than pressure is also improved.

Furthermore, in Embodiment 1, when the diaphragm 24 is not undergoing deformation, the diaphragm 24 and the regulation portion 25 are in the same plane and are merely separated by the slit 41, and therefore the diaphragm 24 and the regulation portion 25 can be created using the same material and using the same film formation process, thus making it possible to simplify the manufacturing process. Moreover, since the slit 41 can be formed by performing photolithography one time and etching one time, the slit 41 can be formed so as to have a narrow width, and the acoustic resistance can be increased. This makes it possible to maintain the low frequency characteristics even if the slit 41 is formed.

Also, it is desirable that in the acoustic sensor 21, the fixed electrode plate 29 is not provided in a region that opposes the regulation portion 25, that is to say, in a region that overlaps with the regulation portion 25 in a view from a direction perpendicular to the upper surface of the substrate 22, as shown in FIG. 4A. This is because the parasitic capacitance generated between the regulation portion 25 and the fixed electrode plate 29 increases if they oppose each other.

Also, a portion of the stoppers 43 are arranged on the lower surface of the back plate 28 in a region that opposes the edge portion of the opening 24a in the diaphragm 24. If stoppers 43 are provided at these positions, it is possible to prevent the diaphragm 24 from adhering to and not separating from the fixed electrode plate 29 when it has undergone large deformation due to a large degree of pressure P.

Embodiment 2

Figure 7A:
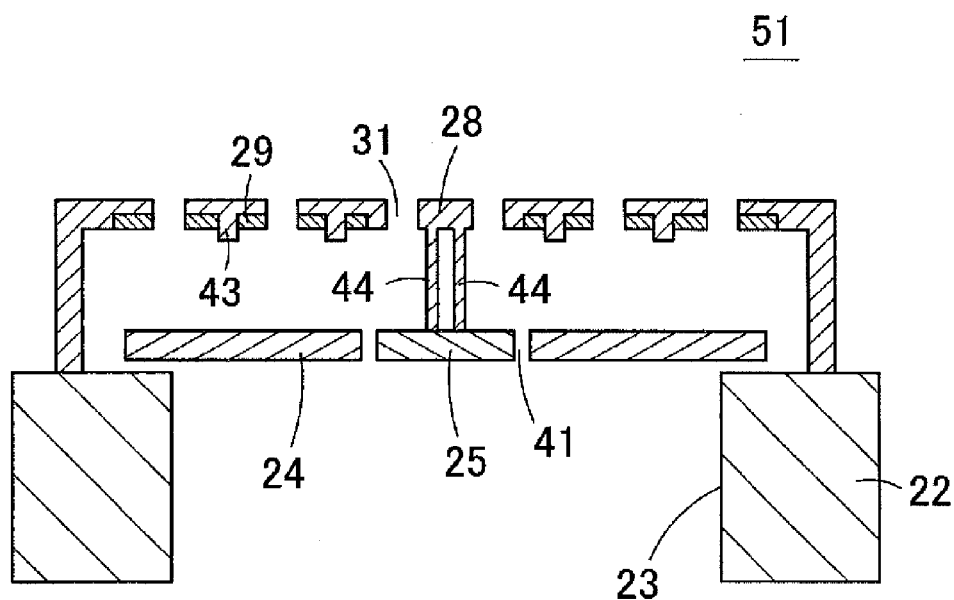
FIG. 7A is a schematic cross-sectional diagram showing an acoustic sensor according to Embodiment 2 of the present invention.
Figure 7B:
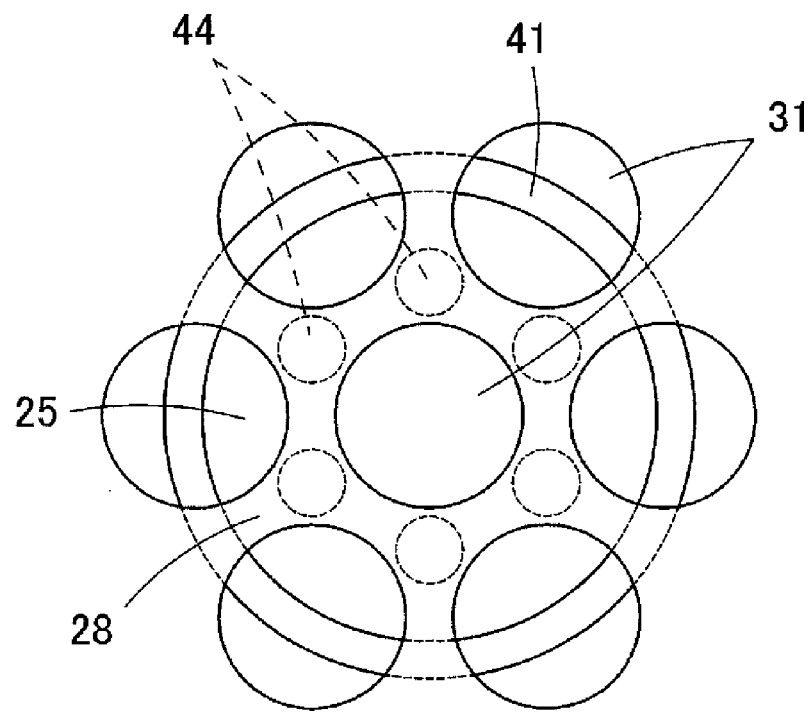
FIG. 7B is a diagram showing the positional relationship between support portions, a leak pressure regulation portion, and acoustic holes in the acoustic sensor shown in FIG. 7A.

FIG. 7A is a schematic cross-sectional diagram showing an acoustic sensor 51 according to Embodiment 2 of the present invention. FIG. 7B is a plan view showing an enlargement of the central portion of a back plate 28 of the acoustic sensor 51.

In the acoustic sensor 51, multiple support portions 44 extend downward from the central portion of the lower surface of the back plate 28, and the regulation portion 25 is supported by these support portions 44. If the regulation portion 25 is supported by multiple support portions 44, the rigidity of the regulation portion 25 increases, and the regulation portion 25 is not likely to undergo deformation even when subjected to a large degree of pressure, thus making it possible to prevent a reduction in the distance between the edge of regulation portion 25 and the edge of the opening 24a of the deformed diaphragm 24.

Remarks Regarding Variations

Figure 8A:
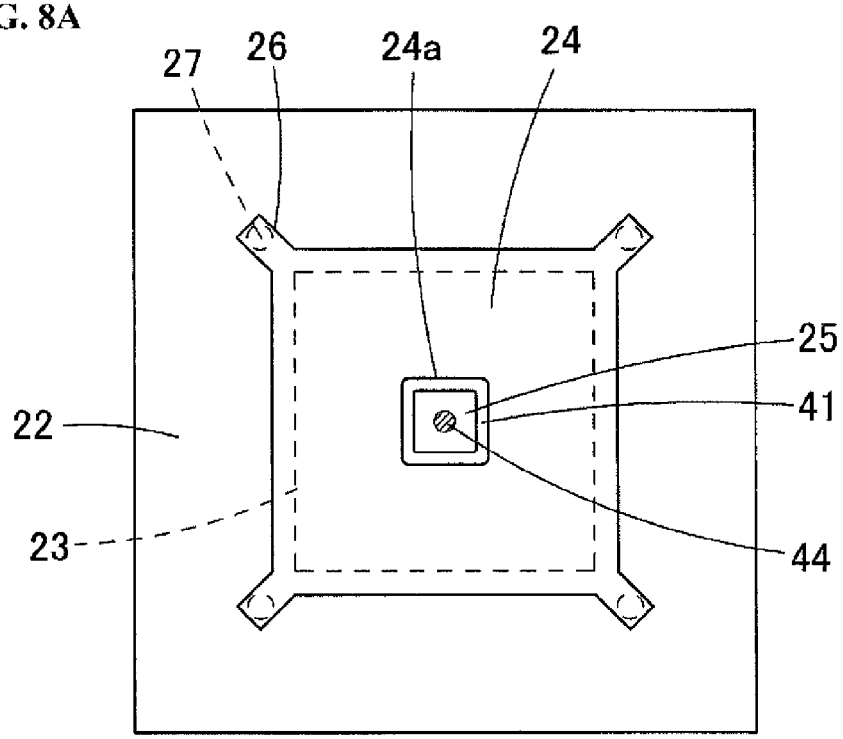
FIG. 8A is a diagram showing a variation of the opening in the diaphragm and the leak pressure regulation portion.

Although the opening 24a and the regulation portion 25 are circular in one or more of the above embodiments, the opening 24a and the regulation portion 25 may be polygonal or rectangular as shown in FIG. 8A. Note that if the opening 24a and the regulation portion 25 are rectangular or polygonal, it is desirable that the corner portions are each rounded so as to reduce the concentration of stress and prevent damage.

Figure 8B:
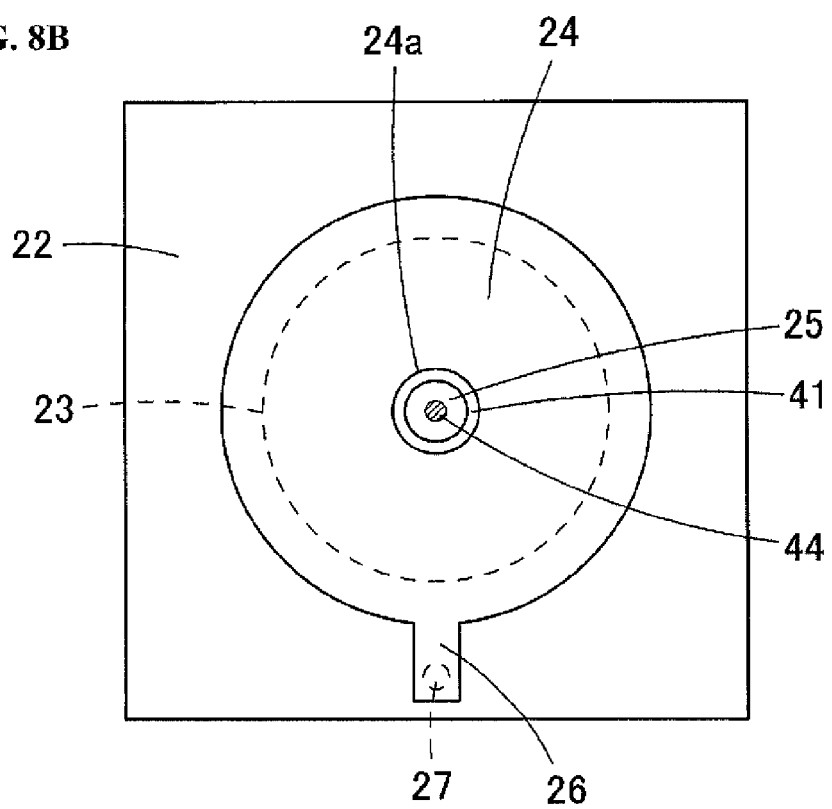
FIG. 8B is a diagram showing a variation of the diaphragm.

Also, the diaphragm 24 is not limited to being rectangular, and may be circular. With the diaphragm 24 shown in FIG. 8B, a circular diaphragm 24 is supported in a cantilever manner by one leg piece 26 fixed to an anchor 27.

Figure 9A:
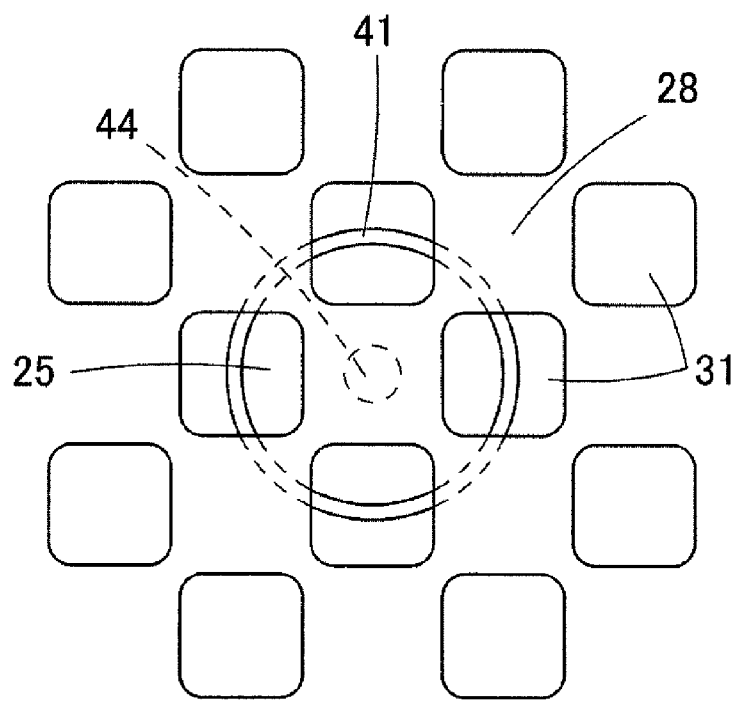
FIGS. 9A and 9B are diagrams showing a different arrangement of the acoustic holes.
Figure 9B:
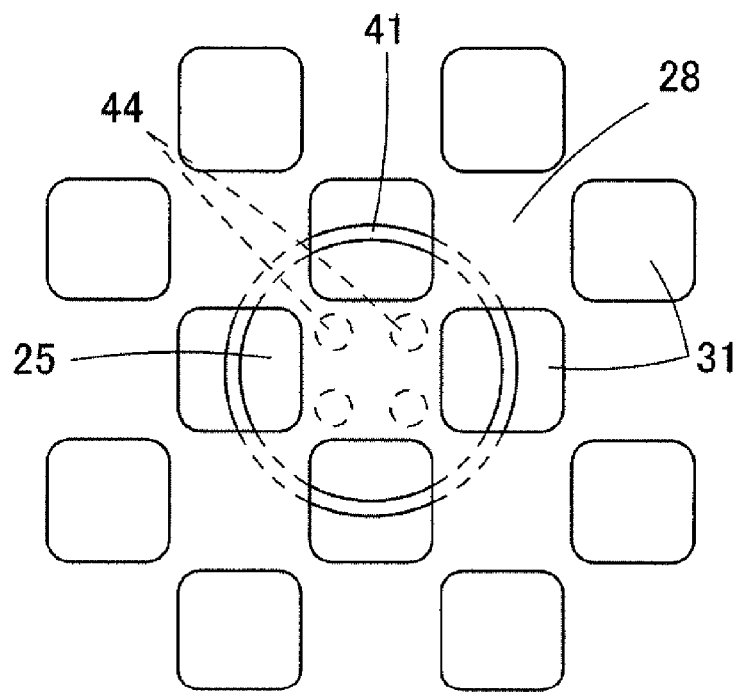

Also, the acoustic holes 31 are not limited to being arranged in a triangular shape as described above, and may be arranged in a rectangular shape along two orthogonal directions. For example, FIG. 9A shows a state in which the regulation portion 25 is supported by one support portion 44 below a back plate 28 in which acoustic holes 31 are arranged in a rectangular shape. FIG. 9B shows a state in which the regulation portion 25 is supported by multiple support portions 44 below a back plate 28 in which acoustic holes 31 are arranged in a rectangular shape.

Embodiment 3

Figure 10:
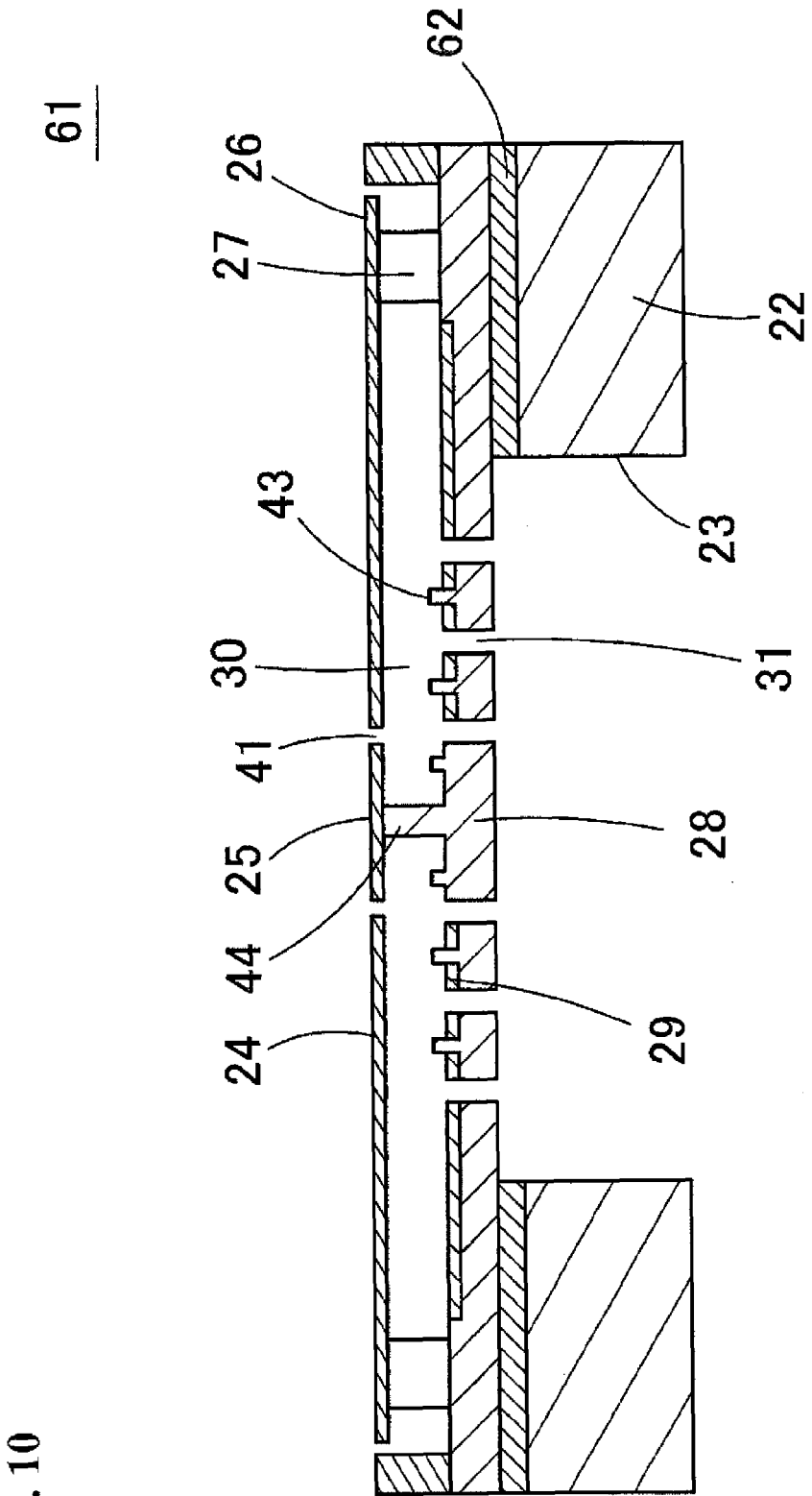
FIG. 10 is a schematic cross-sectional diagram showing an acoustic sensor according to Embodiment 3 of the present invention.

FIG. 10 is a cross-sectional diagram showing an acoustic sensor 61 according to Embodiment 3 of the present invention, a feature of which is that the diaphragm 24 is provided above the fixed electrode plate 29. In the acoustic sensor 61, a flat plate-shaped back plate 28 is provided on the upper surface of the substrate 22 via an insulation layer 62. The fixed electrode plate 29 is formed on the upper surface of the back plate 28. Multiple acoustic holes 31 are formed in the back plate 28 and the fixed electrode plate 29 above the cavity 23. Also, the diaphragm 24 is arranged so as to oppose the fixed electrode plate 29 above the back plate 28. Leg pieces 26 extending from the diaphragm 24 are supported by anchors 27 provided on the upper surface of the back plate 28.

The opening 24a is formed in the central portion of the diaphragm 24, and the regulation portion 25 is arranged inside the opening 24a. The regulation portion 25 is fixed to the upper edge of the support portion 44 standing on the upper surface of the back plate 28.

Embodiment 4

Figure 11:
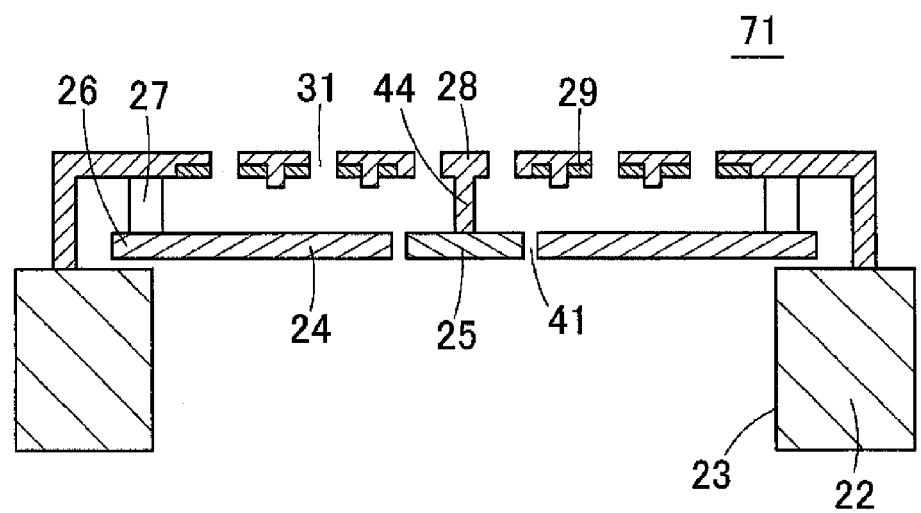
FIG. 11 is a schematic cross-sectional diagram showing an acoustic sensor according to Embodiment 4 of the present invention.

Also, the diaphragm 24 may be supported on the lower surface side of the back plate 28 by anchors 27 provided on the lower surface of the back plate 28 as shown in the acoustic sensor 71 shown in FIG. 11.

Embodiment 5

Figure 12A:
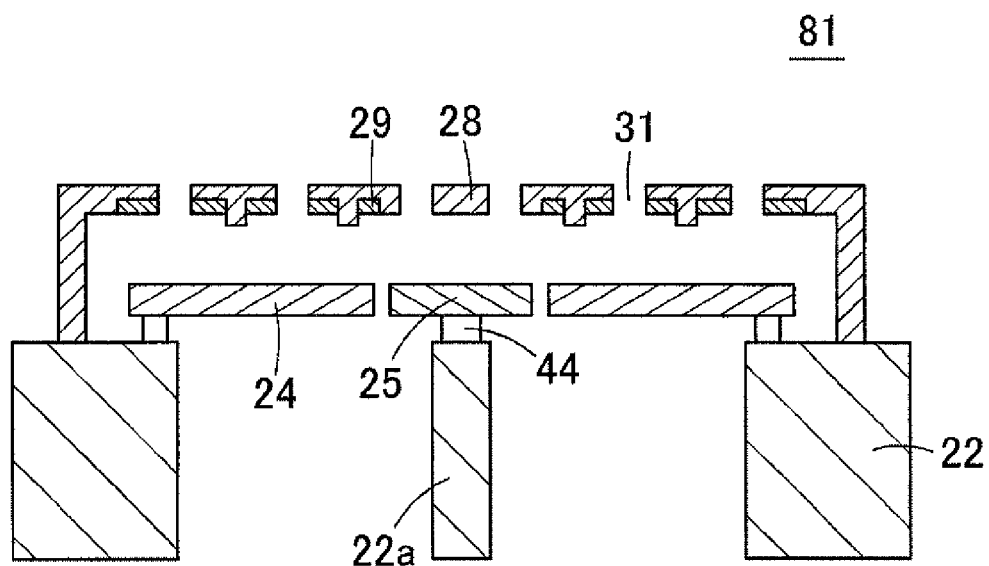
FIG. 12A is a schematic cross-sectional diagram showing an acoustic sensor according to Embodiment 5 of the present invention.
Figure 12B:
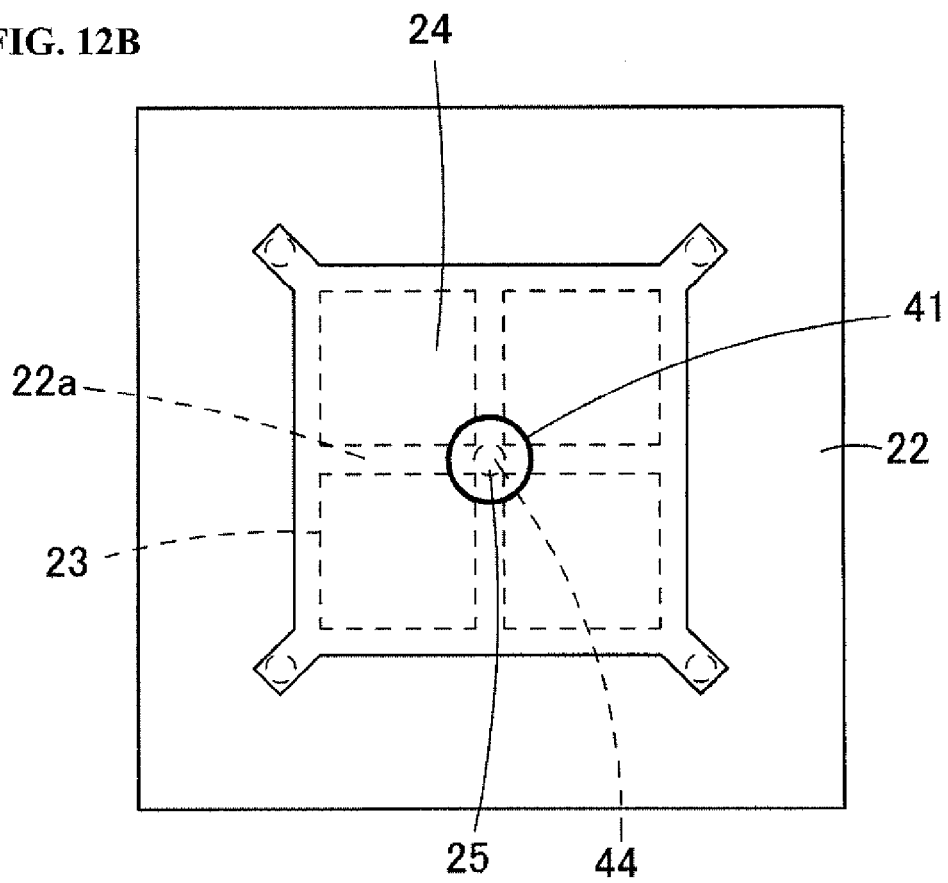
FIG. 12B is a plan view showing a state in which the diaphragm is exposed by removing the back plate and the fixed electrode plate from the acoustic sensor shown in FIG. 12A.
Figure 13:
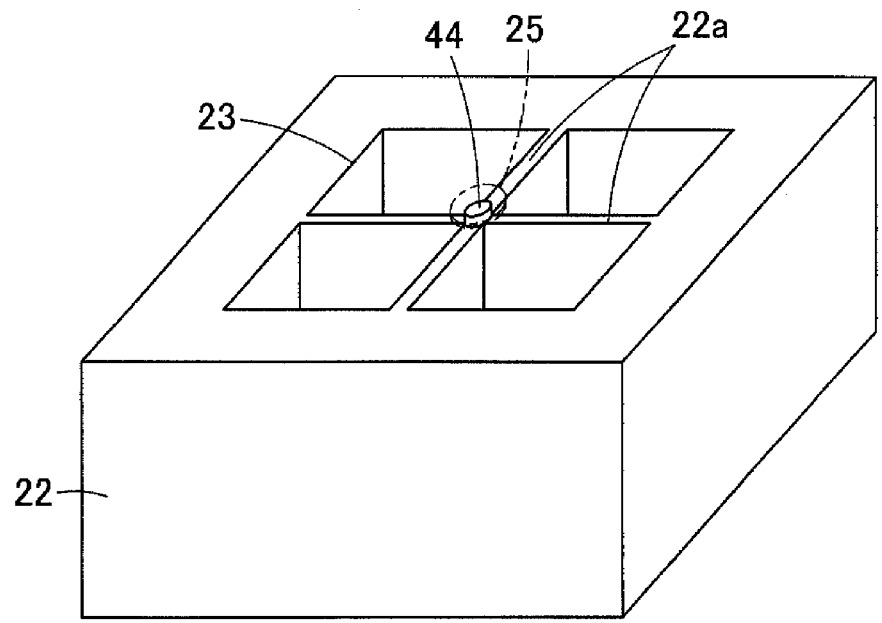
FIG. 13 is a perspective diagram showing a substrate used in the acoustic sensor in FIGS. 12A and 12B.

FIG. 12A is a schematic cross-sectional diagram showing an acoustic sensor 81 according to Embodiment 5 of the present invention. FIG. 12B is a plan view showing a state in which the diaphragm is exposed by removing the back plate and the fixed electrode plate from the acoustic sensor shown in FIG. 12A. In the acoustic sensor 81, the regulation portion 25 is supported by a support portion 44 standing on the upper surface of the substrate 22. As shown in FIG. 13, protrusion portions 22a, which are for the provision of the support portion 44 and are shaped as partition walls, are provided in the cavity 23 of the substrate 22, and the support portion 44 is provided on the upper surface of the protrusion portions 22a in the central portion of the cavity 23. The regulation portion 25 is fixed to the upper surface of the support portion 44. According to Embodiment 5, the support portion 44 and the anchors 27 can be created using the same material and using the same manufacturing process.

Embodiment 6

Figure 14:
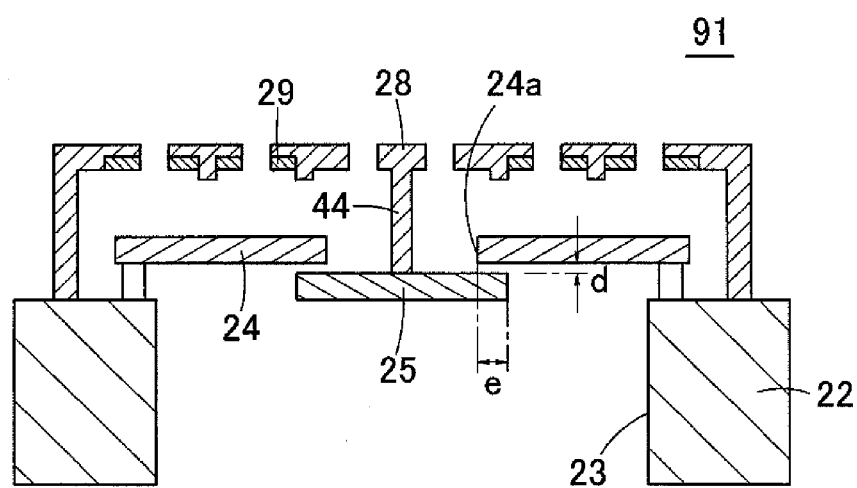
FIG. 14 is a schematic cross-sectional diagram showing an acoustic sensor according to Embodiment 6 of the present invention.

FIG. 14 is a schematic cross-sectional diagram showing an acoustic sensor 91 according to Embodiment 6 of the present invention. In the acoustic sensor 91, the regulation portion 25 is arranged on the lower surface of the diaphragm 24 so as to block the underside of the opening 24a. In the illustrated example, the regulation portion 25 is supported by a support portion 44 provided on the lower surface of the back plate 28, but the regulation portion 25 may be supported by a support portion 44 provided on the upper surface of the substrate 22 as in Embodiment 5.

Note that if the diaphragm 24 interferes with the regulation portion 25 in the acoustic vibration detection mode, vibration of the diaphragm 24 will be hindered, and therefore a gap having an appropriate distance d needs to be provided between the upper surface of the regulation portion 25 and the lower surface of the diaphragm 24. However, since the acoustic resistance decreases as the distance of this gap increases, it is sufficient to increase a length e of the overlapping region of the regulation portion 25 and the diaphragm 24.

Embodiment 7

Figure 15:
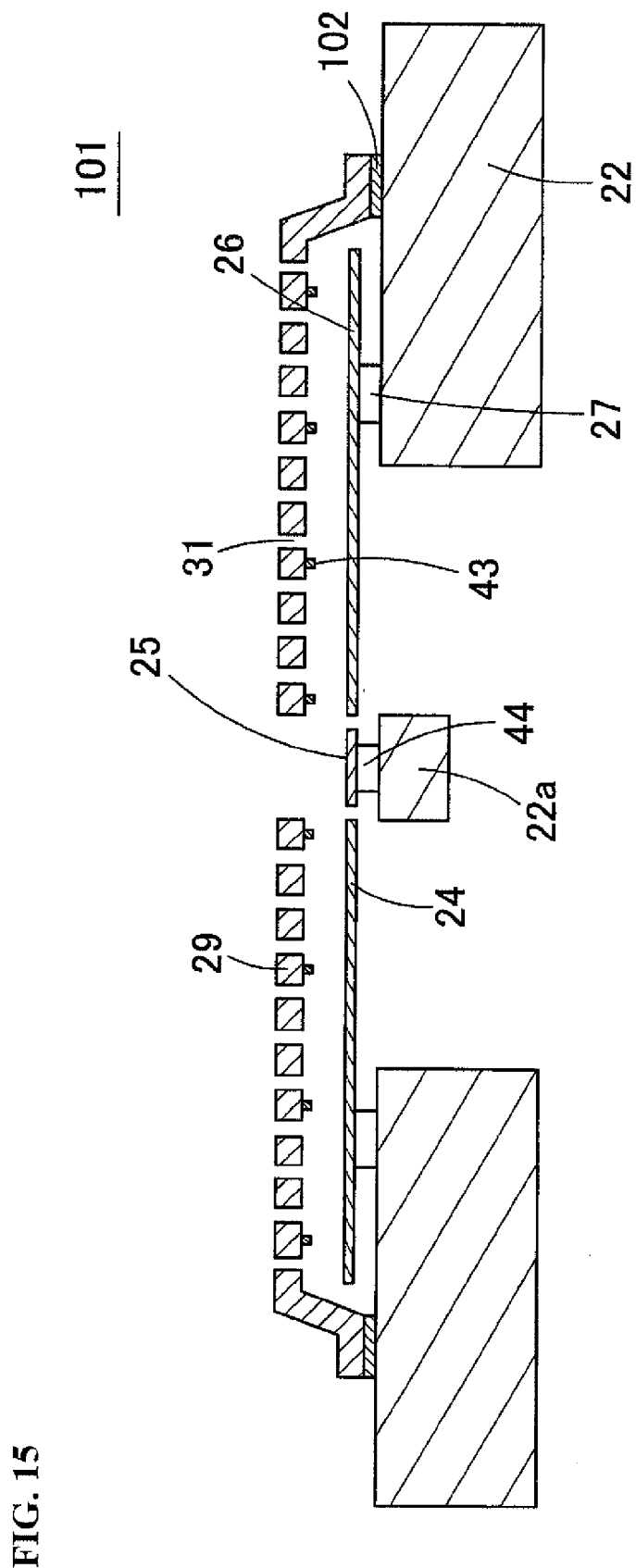
FIG. 15 is a cross-sectional diagram showing an acoustic sensor according to Embodiment 7 of the present invention.

FIG. 15 is a cross-sectional diagram showing an acoustic sensor 101 according to Embodiment 7 of the present invention. In the acoustic sensor 101, the fixed electrode plate 29 is shaped as a dome and has a thickness sufficient for obtaining a necessary rigidity. The fixed electrode plate 29 is provided on the upper surface of the substrate 22 via an insulation layer 102, and covers the diaphragm 24 arranged above the substrate 22. The support portion 44 is provided on the upper surface of a bridge-like protrusion portion 22a provided on the substrate 22. The regulation portion 25 fixed on the upper surface of the support portion 44 is located inside the opening 24a of the diaphragm 24. Also, in order to reduce the parasitic capacitance with the regulation portion 25, an opening is formed in the fixed electrode plate 29 in the region that corresponds to the regulation portion 25. Also, in order to prevent the diaphragm 24 from coming into contact with the fixed electrode plate 29 and shorting or sticking, stoppers 43 made of an insulating material (e.g., SiN) are provided at appropriate intervals on the lower surface of the fixed electrode plate 29. A back plate does not need to be used in the acoustic sensor as in Embodiment 7.

Embodiment 8

In one or more of the above embodiments, the opening 24a provided in the diaphragm 24 is blocked by the regulation portion 25 in the normal operating state, but a configuration is possible in which the opening 24a is blocked by the upper surface of the substrate 22.

Figure 16A:
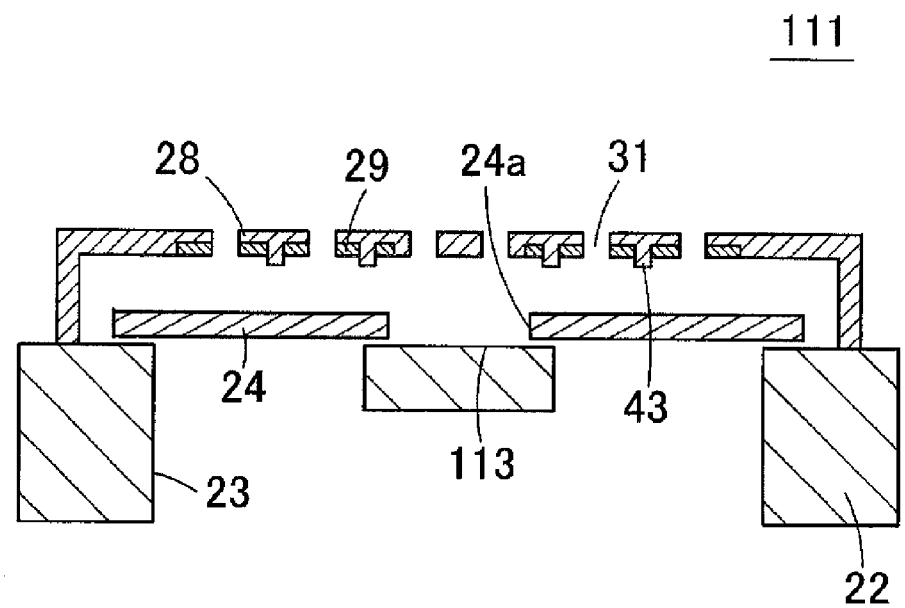
FIG. 16A is a schematic cross-sectional diagram of an acoustic sensor according to Embodiment 8 of the present invention.
Figure 16B:
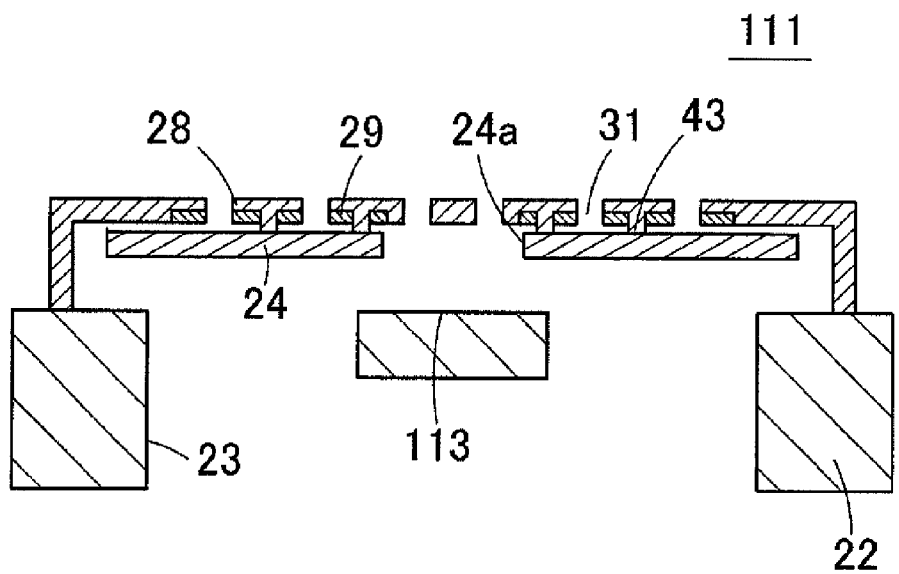
FIG. 16B is a schematic cross-sectional diagram showing a state in which a large degree of pressure is applied to the diaphragm from below in the acoustic sensor in FIG. 16A.
Figure 17A:
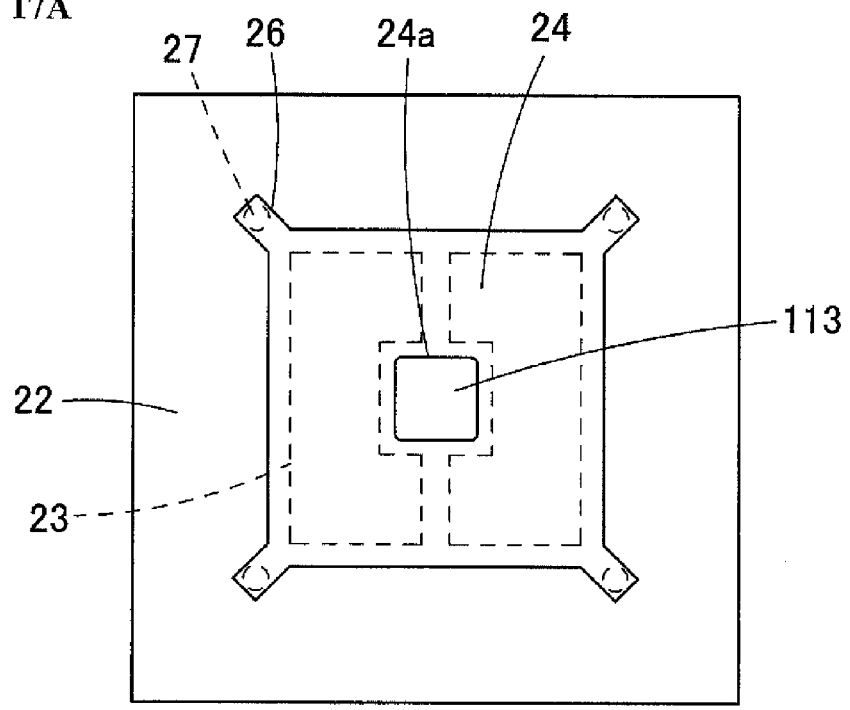
FIG. 17A is a plan view of the acoustic sensor in FIG. 16A in a state in which the back plate has been removed.
Figure 17B:
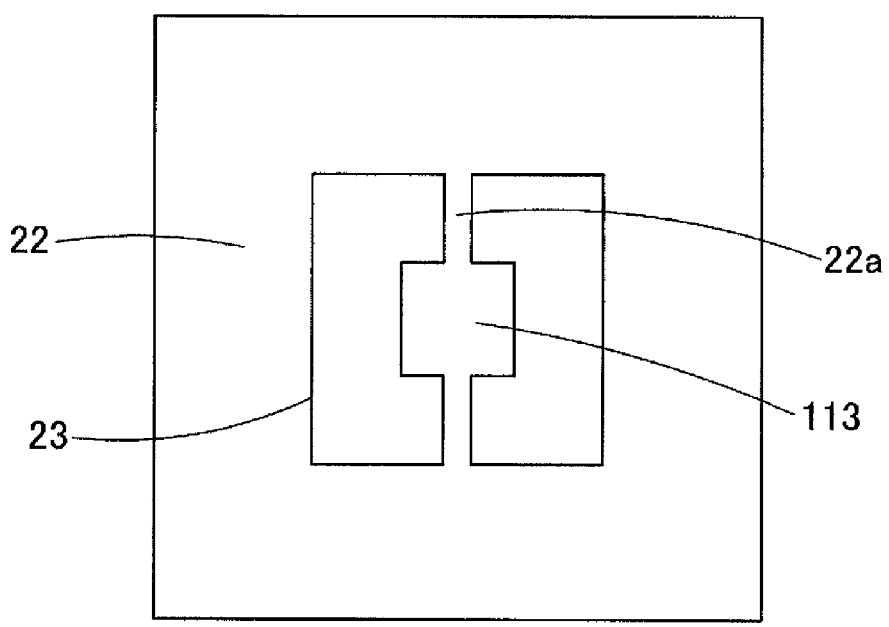
FIG. 17B is a plan view of a substrate used in the acoustic sensor in FIG. 16A.

FIG. 16A is a schematic cross-sectional diagram of an acoustic sensor 111 according to Embodiment 8 of the present invention. FIG. 16B is a schematic cross-sectional diagram of the acoustic sensor 111 in a state in which a large degree of high-load pressure is being applied to the diaphragm 24 from below. Also, FIG. 17A is a plan view of the acoustic sensor 111 in a state in which the back plate 28 has been removed. FIG. 17B is a plan view of the substrate 22 used in the acoustic sensor 111.

In the acoustic sensor 111, the opening 24a is formed in the central portion of the diaphragm 24 as shown in FIG. 17A. On the other hand, as shown in FIG. 17B, a protrusion portion 22a that is shaped as a partition wall or a beam is provided in the cavity 23 of the substrate 22, and the underside of the opening 24a is blocked by the upper surface of the substrate 22, or more specifically an opposing surface 113 that is provided on the upper surface of the central portion of the protrusion portion 22a and opposes the opening 24a. Note that a gap is formed between the upper surface of the protrusion portion 22a and the lower surface of the diaphragm 24, with a distance according to which the diaphragm 24 and the protrusion portion 22a do not come into contact even when the diaphragm 24 is detecting acoustic vibration.

When normal acoustic vibration is being detected in the acoustic sensor 111, the opening 24a is blocked by the upper surface of the substrate 22 (opposing surface 113) as shown in FIG. 16A, and therefore the acoustic resistance of the acoustic sensor 111 is not likely to decrease, and it is possible to maintain the characteristics of the acoustic sensor 111 in the low frequency range. In contrast, when the diaphragm 24 is subjected to high-load pressure P from below, the diaphragm 24 floats upward as shown in FIG.

16B so as to open the opening 24a and allow the pressure P to escape through the opening 24a.

Embodiment 9

Figure 18A:
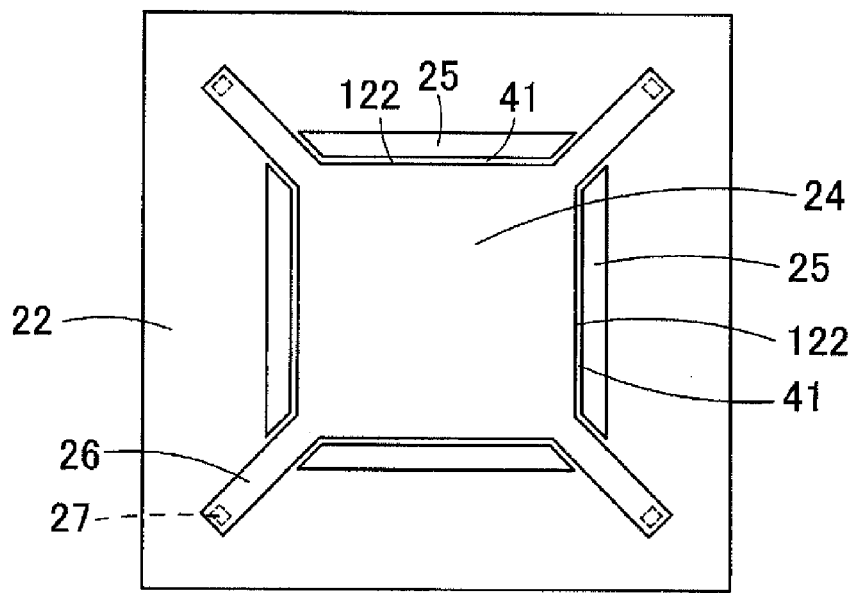
FIG. 18A is a plan view of an acoustic sensor according to Embodiment 9 of the present invention, in a state in which the back plate has been removed.
Figure 18B:
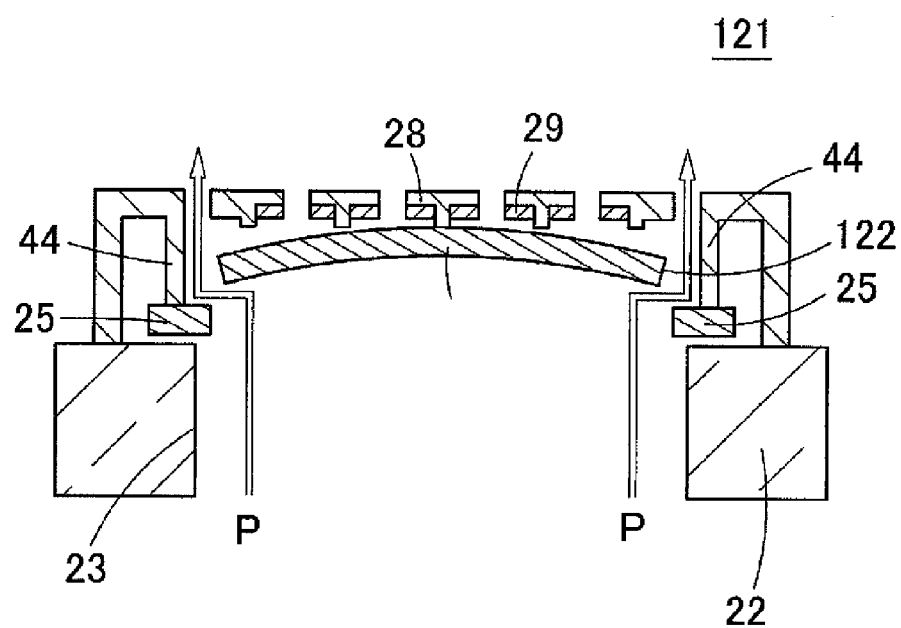
FIG. 18B is a schematic cross-sectional diagram showing a state in which pressure is applied to the acoustic sensor according to Embodiment 9.

FIG. 18A is a plan view showing an acoustic sensor 121 according to Embodiment 9 of the present invention, in a state in which the back plate 28 has been removed. FIG. 18B is a schematic cross-sectional diagram showing a state in which high-load pressure P has been applied to the acoustic sensor 121. In the acoustic sensor 121 of Embodiment 9, void portions that are recessed toward the interior of the diaphragm 24 in the shape of a notch (i.e., recessions 122) are formed in the sides (outer peripheral portions) of the diaphragm 24 as shown in FIG. 18A. According to one or more embodiments of the present invention, the recessions 122 reach the vicinity of the cavity 23, and they may reach the top of the cavity 23. Also, regulation portions 25 are positioned so as to fit into the recessions 122. The regulation portions 25 are supported by support portions 44 provided on the lower surface of the back plate 28. The regulation portions 25 are positioned at the same height as the diaphragm 24, and are separated from the diaphragm 24 by slits 41. According to one or more embodiments of the present invention, the width of the slits 41 is less than or equal to 10 μm in this case as well.

With the acoustic sensor 121 as well, when the diaphragm 24 is subjected to high-load pressure P from the cavity 23 side, the sides of the diaphragm 24 float upward as well as shown in FIG. 18B, and gaps for allowing pressure to escape are formed at the positions of the recessions 122. Accordingly, deformation of the diaphragm 24 can be reduced by allowing the high-load pressure P to escape, and damage to the diaphragm 24 and the back plate 28 can be avoided.

Also, in Embodiment 9, the recessions 122 are provided at locations away from the region of the diaphragm 24 that primarily functions as an electrode (i.e., the central portion), thus reducing the negative influence on the sensitivity of the acoustic sensor 121. Note that since the area of a single recession 122 cannot be made too large in Embodiment 9, it is desirable that multiple separate recessions 122 are provided.

Embodiment 10

Figure 19A:
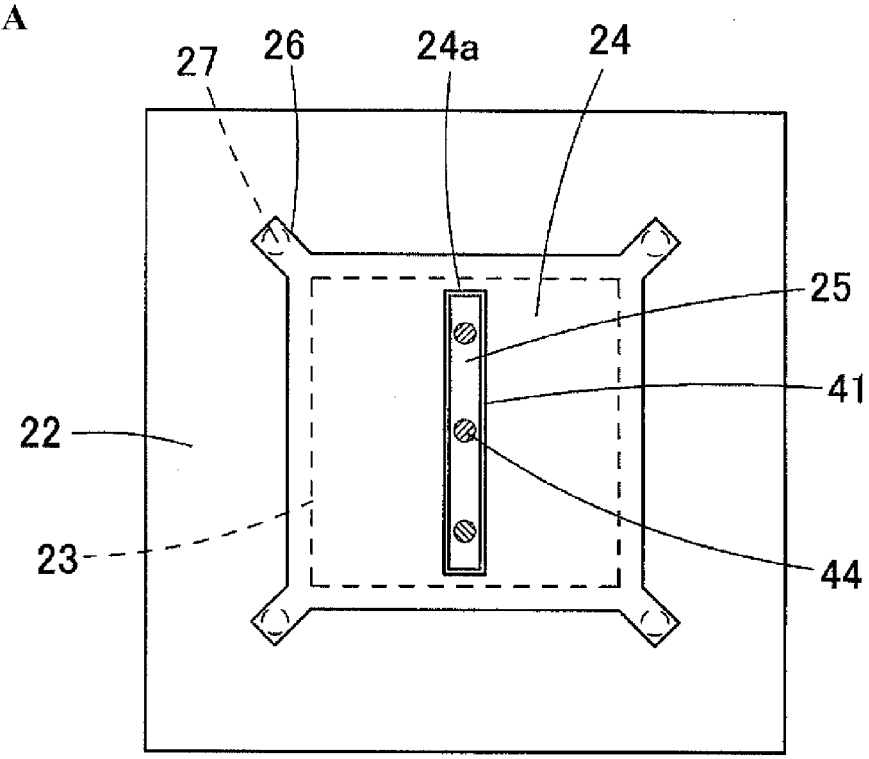
FIG. 19A is a plan view of an acoustic sensor according to Embodiment 10 of the present invention, in a state in which the back plate has been removed.

Also, the void portion for allowing pressure to escape is not limited to being a circular or rectangular opening, and may be a slit-shaped opening. For example, FIG. 19A is a plan view showing an acoustic sensor 131 according to Embodiment 10 of the present invention, in a state in which the back plate 28 has been removed. In this example, a slit-shaped opening 24a is provided in the diaphragm 24, and an elongated rectangular regulation portion 25 is positioned inside the opening 24a.

Figure 19B:
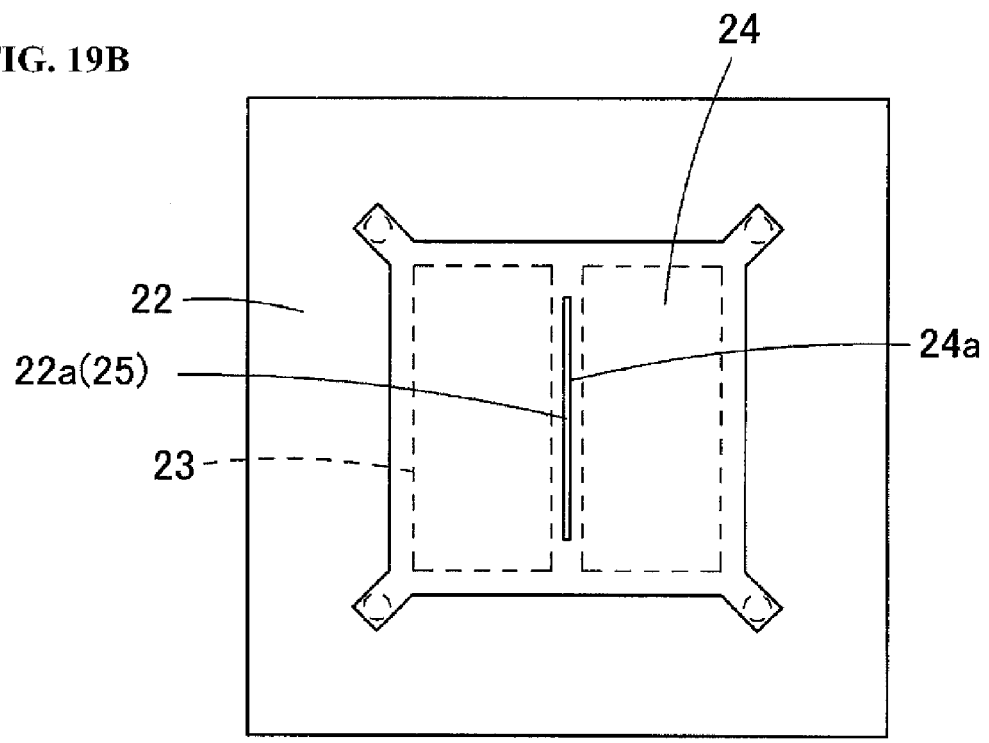
FIG. 19B is a plan view of an acoustic sensor according to a variation of Embodiment 10 of the present invention, in a state in which the back plate has been removed.

Also, as shown in FIG. 19B, a slit-shaped elongated opening 24a is provided in the diaphragm 24, the substrate 22 is provided with a protrusion portion 22a that opposes the underside of the opening 24a, and the leakage of air pressure from the opening 24a is prevented by the upper surface of the protrusion portion 22a serving as the regulation portion 25.

Application in Microphone

Figure 20:
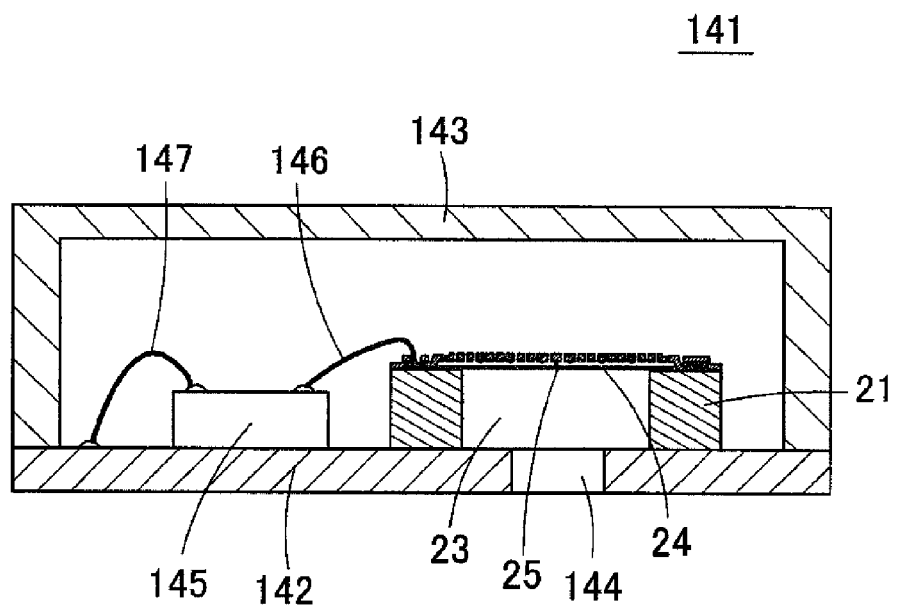

FIG. 20 is a schematic cross-sectional diagram of a bottom port type of microphone 141 including an acoustic sensor according to one or more embodiments of the present invention, such as the acoustic sensor 21 of Embodiment 1. This microphone 141 has the acoustic sensor 21 and a signal processing circuit 145 (ASIC), which is a circuit portion, built into a package made up of a circuit substrate 142 and a cover 143. The acoustic sensor 21 and the signal processing circuit 145 are mounted on the upper surface of the circuit substrate 142. A sound introduction hole 144 for the introduction of acoustic vibration into the acoustic sensor 21 is formed in the circuit substrate 142. The acoustic sensor 21 is mounted on the upper surface of the circuit substrate 142 such that the lower opening of the cavity 23 is aligned with the sound introduction hole 144 and covers the sound introduction hole 144. Accordingly, the cavity 23 of the acoustic sensor 21 is the front chamber, and the space inside the package is the back chamber.

The acoustic sensor 21 and the signal processing circuit 145 are connected by a bonding wire 146. Furthermore, the signal processing circuit 145 is connected to the circuit substrate 142 by a bonding wire 147. Note that signal processing circuit 145 has a function of supplying power to the acoustic sensor 21 and a function of outputting a capacitance change signal from the acoustic sensor 21 to the outside.

A cover 143 is attached to the upper surface of the circuit substrate 142 so as to cover the acoustic sensor 21 and the signal processing circuit 145. The package has an electromagnetic shielding function, and protects the acoustic sensor 21 and the signal processing circuit 145 from mechanical shock and electrical disturbances from the outside.

In this way, acoustic vibration that has entered the cavity 23 through the sound introduction hole 144 is detected by the acoustic sensor 21, and then output after being subjected to amplification and signal processing by the signal processing circuit 145. Since the space inside the package is the back chamber in this microphone 141, the area of the back chamber can be increased, and the sensitivity of the microphone 141 can be increased.

Note that in this microphone 141, the sound introduction hole 144 for introducing acoustic vibration into the package may be formed in the upper surface of the cover 143. In this case, the cavity 23 of the acoustic sensor 21 is the back chamber, and the space inside the package is the front chamber.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An acoustic transducer comprising:
   a substrate having a cavity;
   a vibrating electrode plate disposed above the substrate and having a void portion that allows pressure to escape;
   a fixed electrode plate disposed above the substrate opposite the vibrating electrode plate; and
   a leak pressure regulation portion that hinders leakage of air pressure by passing through the void portion when the vibrating electrode plate is not undergoing deformation, and that becomes separated from the void portion and allows pressure to escape by passing through the void portion when the vibrating electrode plate undergoes deformation from being subjected to pressure,
   wherein the void portion is a recession that is formed in an edge of the vibrating electrode plate and is recessed toward the interior of the vibrating electrode plate, and wherein the leak pressure regulation portion is a plate-shaped member that is located in the recession in the vibrating electrode plate when the vibrating electrode plate is not undergoing deformation.

2. The acoustic transducer according to claim 1, wherein the void portion is an opening formed in the vibrating electrode plate.

3. The acoustic transducer according to claim 2, wherein the leak pressure regulation portion is a plate-shaped member that is accommodated in the opening in the vibrating electrode plate when the vibrating electrode plate is not undergoing deformation.

4. The acoustic transducer according to claim 1, wherein the leak pressure regulation portion is disposed opposite to an upper side or a lower side of the vibrating electrode plate to block one of an upper opening and a lower opening of the void portion in the vibrating electrode plate when the vibrating electrode plate is not undergoing deformation.

5. The acoustic transducer according to claim 4, wherein the leak pressure regulation portion is an upper surface of a portion of the substrate that is positioned to block the lower opening of the void portion in the vibrating electrode plate when the vibrating electrode plate is not undergoing deformation.

6. The acoustic transducer according to claim 1,
wherein the leak pressure regulation portion is positioned in the void portion in the vibrating electrode plate when the vibrating electrode plate is not undergoing deformation, and
wherein a slit is formed between an edge of the leak pressure regulation portion and an edge of the void portion.

7. The acoustic transducer according to claim 6, wherein the width of the slit is less than or equal to 10 μm.

8. The acoustic transducer according to claim 1,
wherein a back plate is disposed above the substrate opposite the vibrating electrode plate,
wherein a support portion is disposed on a surface of the back plate opposite the vibrating electrode plate, and
wherein the leak pressure regulation portion is fixed to the support portion.

9. The acoustic transducer according to claim 8, wherein the horizontal cross-sectional area of the support portion is smaller than the area of the leak pressure regulation portion.

10. The acoustic transducer according to claim 8, wherein the leak pressure regulation portion is supported by a plurality of support portions.

11. The acoustic transducer according to claim 10, wherein a through-hole is disposed in the back plate between adjacent support portions.

12. The acoustic transducer according to claim 1, wherein the leak pressure regulation portion is fixed to a support portion provided on an upper surface of the substrate.

13. The acoustic transducer according to claim 1,
wherein a back plate is disposed above the substrate opposite the vibrating electrode plate,
wherein the fixed electrode plate is disposed on the back plate opposite the vibrating electrode plate,
wherein a plurality of acoustic holes are formed in the back plate and the fixed electrode plate, and
wherein a portion of the acoustic holes are overlapped with the void portion in a view from a direction perpendicular to the upper surface of the substrate.

14. The acoustic transducer according to claim 6,
wherein a back plate is disposed above the substrate opposite the vibrating electrode plate,
wherein the fixed electrode plate is disposed on the back plate opposite the vibrating electrode plate,
wherein a plurality of acoustic holes are formed in the back plate and the fixed electrode plate, and
wherein a portion of the acoustic holes are overlapped with the slit in a view from a direction perpendicular to the upper surface of the substrate.

15. The acoustic transducer according to claim 1,
wherein a back plate is disposed above the substrate opposite the vibrating electrode plate,
wherein the fixed electrode plate is disposed on the back plate opposite the vibrating electrode plate,
wherein a plurality of acoustic holes are formed in the back plate and the fixed electrode plate, and
wherein the width of the leak pressure regulation portion is greater than the distance between adjacent acoustic holes in a view from a direction perpendicular to the upper surface of the substrate.

16. The acoustic transducer according to claim 1,
wherein a back plate is disposed above the substrate opposite the vibrating electrode plate, and
wherein the fixed electrode plate is disposed on the back plate so as to oppose the vibrating electrode plate and to not oppose the leak pressure regulation portion.

17. The acoustic transducer according to claim 1,
wherein a back plate is disposed above the substrate opposite the vibrating electrode plate, and
wherein a protrusion is disposed on the back plate so as to oppose a region of the vibrating electrode plate that is adjacent to the void portion.

18. The acoustic transducer according to claim 1, wherein the void portion is disposed in a region where the amount of deformation of the vibrating electrode plate is large.

19. The acoustic transducer according to claim 1, wherein the vibrating electrode plate and the leak pressure regulation portion are formed from a same material and have a same thickness.

20. The acoustic transducer according to claim 19, wherein the leak pressure regulation portion and the vibrating electrode plate having the void portion are formed by forming a thin film over the substrate and dividing the thin film with a slit in a manufacturing process.

21. A microphone comprising:
the acoustic transducer according to claim 1; and
a circuit portion that amplifies a signal from the acoustic transducer and outputs the amplified signal to the outside.

* * * * *